United States Patent
Shih et al.

(10) Patent No.: US 11,877,419 B2
(45) Date of Patent: Jan. 16, 2024

(54) CHASSIS STRUCTURE AND ELECTRONIC DEVICE THEREWITH

(71) Applicant: Wistron Corporation, New Taipei (TW)

(72) Inventors: Ming-Chih Shih, New Taipei (TW); Jun Hao Wang, New Taipei (TW); Qi-Hong Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/711,068

(22) Filed: Apr. 1, 2022

(65) Prior Publication Data

US 2023/0199997 A1 Jun. 22, 2023

(30) Foreign Application Priority Data

Dec. 22, 2021 (CN) .......................... 202111580745.6

(51) Int. Cl.
*H05K 7/14* (2006.01)
(52) U.S. Cl.
CPC .................................. *H05K 7/1488* (2013.01)
(58) Field of Classification Search
None
See application file for complete search history.

(56) References Cited

U.S. PATENT DOCUMENTS

| 4,392,503 | A | * | 7/1983 | Watanabe | A45C 13/1084 |
| | | | | | 132/301 |
| 4,909,579 | A | * | 3/1990 | Liu | G06F 1/181 |
| | | | | | 220/812 |
| 5,743,606 | A | * | 4/1998 | Scholder | F16B 12/26 |
| | | | | | 361/725 |
| 6,053,586 | A | * | 4/2000 | Cook | E05B 65/006 |
| | | | | | 312/265.5 |
| 6,356,436 | B1 | * | 3/2002 | Buican | G06F 1/181 |
| | | | | | 312/263 |
| 6,392,874 | B1 | | 5/2002 | Gan | |

(Continued)

FOREIGN PATENT DOCUMENTS

| DE | 103 37 367 A1 | 3/2004 |
| EP | 2 107 444 A1 | 10/2009 |
| TW | 201228524 A1 | 7/2012 |

*Primary Examiner* — James Wu
*Assistant Examiner* — Christopher L Augustin
(74) *Attorney, Agent, or Firm* — Winston Hsu

(57) ABSTRACT

A chassis structure is provided and includes a main body, a lateral plate and a restraining mechanism. The lateral plate is detachably installed on the main body. The restraining mechanism is disposed between the main body and the lateral plate. The restraining mechanism includes a first restraining component and a second restraining component. The first restraining component is disposed on one of the main body and the lateral plate. The second restraining component is disposed on another one of the main body and the lateral plate. The first restraining component is configured to abut against the second restraining component to restrain a pivotal angle of the lateral plate relative to the main body for positioning the lateral plate at a supporting position relative to the main body, so as to prevent the lateral plate from falling off. Besides, an electronic device having the aforementioned chassis structure is provided.

16 Claims, 19 Drawing Sheets

(56) References Cited

U.S. PATENT DOCUMENTS

| | | | |
|---|---|---|---|
| 6,595,605 B1 | 7/2003 | Babcock | |
| 6,819,551 B2 * | 11/2004 | Chen | G06F 1/181 361/679.02 |
| 6,935,661 B1 * | 8/2005 | Farnsworth | E05C 1/04 292/120 |
| 7,095,609 B2 * | 8/2006 | Erickson | G06F 1/181 312/223.2 |
| 10,798,837 B1 * | 10/2020 | Sauer | H05K 5/0221 |
| 2005/0237706 A1 | 10/2005 | Li | |
| 2011/0156549 A1 * | 6/2011 | Zhang | H05K 5/0221 292/13 |
| 2014/0251678 A1 * | 9/2014 | Chen | G06F 1/181 174/520 |
| 2019/0364681 A1 * | 11/2019 | Hangebrauck | H05K 5/0221 |

* cited by examiner

CHASSIS STRUCTURE AND ELECTRONIC DEVICE THEREWITH

BACKGROUND OF THE INVENTION

1. Field of the Invention

The present invention relates to a chassis structure and an electronic device therewith, and more specifically, to a chassis structure capable of preventing a lateral plate from falling off and an electronic device therewith.

2. Description of the Prior Art

A conventional server usually includes a chassis having a main body and a lateral plate detachably installed on the main body. When it is desired to detach the lateral plate from the main body, a user has to unlock the lateral plate firstly. During an unlocking operation, the user has to hold the lateral plate for preventing the lateral plate from accidentally falling off. However, as the user unlocks a heavy lateral plate, it is difficult for the user to hold the heavy lateral plate. Furthermore, the falling lateral plate may cause damage of devices or injury of personnel. Therefore, an improvement is required.

SUMMARY OF THE INVENTION

It is an objective of the present invention to provide a chassis structure capable of preventing a lateral plate from falling off and an electronic device therewith for solving the aforementioned problem.

In order to achieve the aforementioned objective, the present invention discloses a chassis structure. The chassis structure includes a main body, a lateral plate and a restraining mechanism. The lateral plate is detachably installed on the main body. The restraining mechanism is disposed between the main body and the lateral plate. The restraining mechanism includes at least one first restraining component and at least one second restraining component. The at least one first restraining component is configured to abut against the at least one second restraining component to restrain a pivotal angle of the lateral plate relative to the main body along a first pivoting direction for positioning the lateral plate at a supporting position relative to the main body, and a gap is formed between the lateral plate and the main body when the lateral plate is located at the supporting position.

According to an embodiment of the present invention, the at least one first restraining component is disposed on one of the main body and the lateral plate. The at least one second restraining component is disposed on another one of the main body and the lateral plate. The at least one first restraining component is a restraining hook. The at least one second restraining component is a restraining protrusion, and the restraining hook is configured to abut against the restraining protrusion.

According to an embodiment of the present invention, at least a portion of the restraining hook is made of resilient material. The restraining protrusion pushes the restraining hook to resiliently deform the restraining hook for allowing the lateral plate to pivot to an open position through the supporting position along the first pivoting direction when the lateral plate is pivoted toward the open position along the first pivoting direction, and the gap formed between the lateral plate and the main body increases during a process that the lateral plate pivots from the supporting position to the open position along the first pivoting direction.

According to an embodiment of the present invention, the restraining hook includes a first resilient deformation portion and a second resilient deformation portion. The first resilient deformation portion is disposed on the one of the main body and the lateral plate. The second resilient deformation portion extends from the first resilient deformation portion, and the restraining protrusion pushes the restraining hook to resiliently deform the second resilient deformation portion along the first pivoting direction when the lateral plate is pivoted toward the open position along the first pivoting direction.

According to an embodiment of the present invention, the restraining hook further includes an abutting protrusion extending from the second resilient deformation portion. The abutting protrusion includes a first abutting inclined wall, and the restraining protrusion pushes the first abutting inclined wall to resiliently deform the second resilient deformation portion along the first pivoting direction when the lateral plate is pivoted toward the open position along the first pivoting direction.

According to an embodiment of the present invention, the first resilient deformation portion includes a first part and a second part. The second resilient deformation portion includes a third part and a fourth part. The first part is disposed on the one of the main body and the lateral plate. The second part extends from the first part and is connected to the fourth part. The third part extends from the fourth part, and the abutting protrusion extends from the third part.

According to an embodiment of the present invention, a fulcrum is formed on the first resilient deformation portion, and a first acting force acting on the first abutting inclined wall by the restraining protrusion passes through the fulcrum.

According to an embodiment of the present invention, the restraining protrusion pushes the restraining hook to resiliently deform the restraining hook for allowing the lateral plate to pivot to a closed position through the supporting position along a second pivoting direction opposite to the first pivoting direction when the lateral plate is pivoted toward the closed position along the second pivoting direction. The gap formed between the lateral plate and the main body decreases during a process that the lateral plate pivots from the supporting position to the closed position along the second pivoting direction. The abutting protrusion further includes a second abutting inclined wall. An inclined direction of the second abutting inclined wall is opposite to an inclined direction of the first abutting inclined wall. The restraining protrusion pushes the second abutting inclined wall to resiliently deform the first resilient deformation portion along the first pivoting direction when the lateral plate is pivoted toward the closed position along the second pivoting direction, and a second acting force acting on the second abutting inclined wall by the restraining protrusion does not pass through the fulcrum.

According to an embodiment of the present invention, the second resilient deformation portion includes a movable component and a resilient component. The movable component is pivotally connected to the first resilient deformation portion. The resilient component is connected between the movable component and the first resilient deformation portion, and the abutting protrusion extends from the movable component.

According to an embodiment of the present invention, the chassis structure further includes a pivoting mechanism. The pivoting mechanism has a pivoting axis and is configured to allow the lateral plate to pivot relative to the main body around the pivoting axis. The pivoting mechanism includes at least one first bending plate and at least one second bending plate. The at least one first bending plate is disposed on the lateral plate. The at least one second bending plate is disposed on the main body. The at least one first bending plate is located above the at least one second bending plate, and an end of the at least one second bending plate is configured to abut against the at least one first bending plate, so as to form the pivoting axis by an abutting cooperation of the at least one first bending plate and the at least one second bending plate.

According to an embodiment of the present invention, the lateral plate is slidable relative to the main body between a locking position and an unlocking position. The lateral plate is restrained from pivoting relative to the main body when the lateral plate is located at the locking position relative to the main body. The lateral plate is allowed to pivot relative to the main body when the lateral plate is located at the unlocking position relative to the main body. The chassis structure further includes a locking mechanism disposed between the main body and the lateral plate. The locking mechanism is configured to restrain the lateral plate from pivoting relative to the main body when the lateral plate is located at the locking position relative to the main body, and the locking mechanism is further configured to allow the lateral plate to pivot relative to the main body when the lateral plate is located at the unlocking position relative to the main body.

According to an embodiment of the present invention, the locking mechanism includes at least one locking hook and at least one locking slot. The at least one locking hook is disposed on one of the main body and the lateral plate. The at least one locking slot is disposed on another one of the main body and the lateral plate, the at least one locking hook engages with the at least one locking slot to restrain the lateral plate from pivoting relative to the main body when the lateral plate is located at the locking position relative to the main body. The at least one locking hook disengages from the at least one locking slot to allow the lateral plate to pivot relative to the main body when the lateral plate is located at the unlocking position relative to the main body. The lateral plate is slidable relative to the main body along a sliding direction, and the at least one locking hook and the at least one locking slot engage with or disengage from each other along the sliding direction.

According to an embodiment of the present invention, the chassis structure further includes a pushing structure. The pushing structure includes an operating handle and a pushing component. The operating handle is movably linked to the pushing component. The operating handle is pivotally disposed on the lateral plate, and the operating handle drives the pushing component to push the main body to drive the lateral plate to slide relative to the main body from the locking position to the unlocking position when the operating handle pivots relative to the lateral plate.

In order to achieve the aforementioned objective, the present invention further discloses an electronic device. The electronic device includes a chassis structure and at least one electronic module. The chassis structure includes a main body, a lateral plate and a restraining mechanism. The lateral plate is detachably installed on the main body. The restraining mechanism is disposed between the main body and the lateral plate. The restraining mechanism includes at least one first restraining component and at least one second restraining component. The at least one first restraining component is configured to abut against the at least one second restraining component to restrain a pivotal angle of the lateral plate relative to the main body along a first pivoting direction for positioning the lateral plate at a supporting position relative to the main body, and a gap is formed between the lateral plate and the main body when the lateral plate is located at the supporting position. The at least one electronic module is installed inside the chassis structure.

According to an embodiment of the present invention, the at least one first restraining component is disposed on one of the main body and the lateral plate. The at least one second restraining component is disposed on another one of the main body and the lateral plate. The at least one first restraining component is a restraining hook. The at least one second restraining component is a restraining protrusion, and the restraining hook is configured to abut against the restraining protrusion.

According to an embodiment of the present invention, at least a portion of the restraining hook is made of resilient material. The restraining protrusion pushes the restraining hook to resiliently deform the restraining hook for allowing the lateral plate to pivotally pass through the supporting position when the lateral plate is pivoted toward an open position or a closed position. The gap formed between the lateral plate and the main body increases during a process that the lateral plate pivots from the supporting position to the open position along the first pivoting direction, and the gap formed between the lateral plate and the main body decreases during a process that the lateral plate pivots from the supporting position to the closed position along a second pivoting direction opposite to the first pivoting direction.

According to an embodiment of the present invention, the restraining hook includes a first resilient deformation portion and a second resilient deformation portion. The first resilient deformation portion is disposed on the one of the main body and the lateral plate. The second resilient deformation portion extends from the first resilient deformation portion. The restraining protrusion pushes the restraining hook to resiliently deform the second resilient deformation portion along the first pivoting direction when the lateral plate is pivoted toward the open position along the first pivoting direction, and the restraining protrusion pushes the restraining hook to resiliently deform the first resilient deformation portion along the first pivoting direction when the lateral plate is pivoted toward the closed position along the second pivoting direction.

According to an embodiment of the present invention, the restraining hook further includes an abutting protrusion extending from the second resilient deformation portion. The abutting protrusion includes a first abutting inclined wall and a second abutting inclined wall. An inclined direction of the second abutting inclined wall is opposite to an inclined direction of the first abutting inclined wall. The restraining protrusion pushes the first abutting inclined wall to resiliently deform the second resilient deformation portion along the first pivoting direction when the lateral plate is pivoted toward the open position along the first pivoting direction, and the restraining protrusion pushes the second abutting inclined wall to resiliently deform the first resilient deformation portion along the first pivoting direction when the lateral plate is pivoted toward the closed position along the second pivoting direction.

According to an embodiment of the present invention, the first resilient deformation portion includes a first part and a second part. The second resilient deformation portion includes a third part and a fourth part. The first part is disposed on the one of the main body and the lateral plate. The second part extends from the first part and is connected to the fourth part. The third part extends from the fourth part, and the abutting protrusion extends from the third part.

According to an embodiment of the present invention, the second resilient deformation portion includes a movable component and a resilient component. The movable component is pivotally connected to the first resilient deformation portion. The resilient component is connected between the movable component and the first resilient deformation portion, and the abutting protrusion extends from the movable component.

In summary, the restraining mechanism of the present invention can restrain the pivotal angle of the lateral plate relative to the main body along the first pivoting direction to position the lateral plate at the supporting position for preventing the lateral plate from falling off after the lateral plate is located at the unlocking position relative to the main body. Therefore the present invention has better using convenience and safety.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is coupled to a second device, that connection may be through a direct mechanical connection, or through an indirect mechanical connection via other devices and connections.

Figure 1:
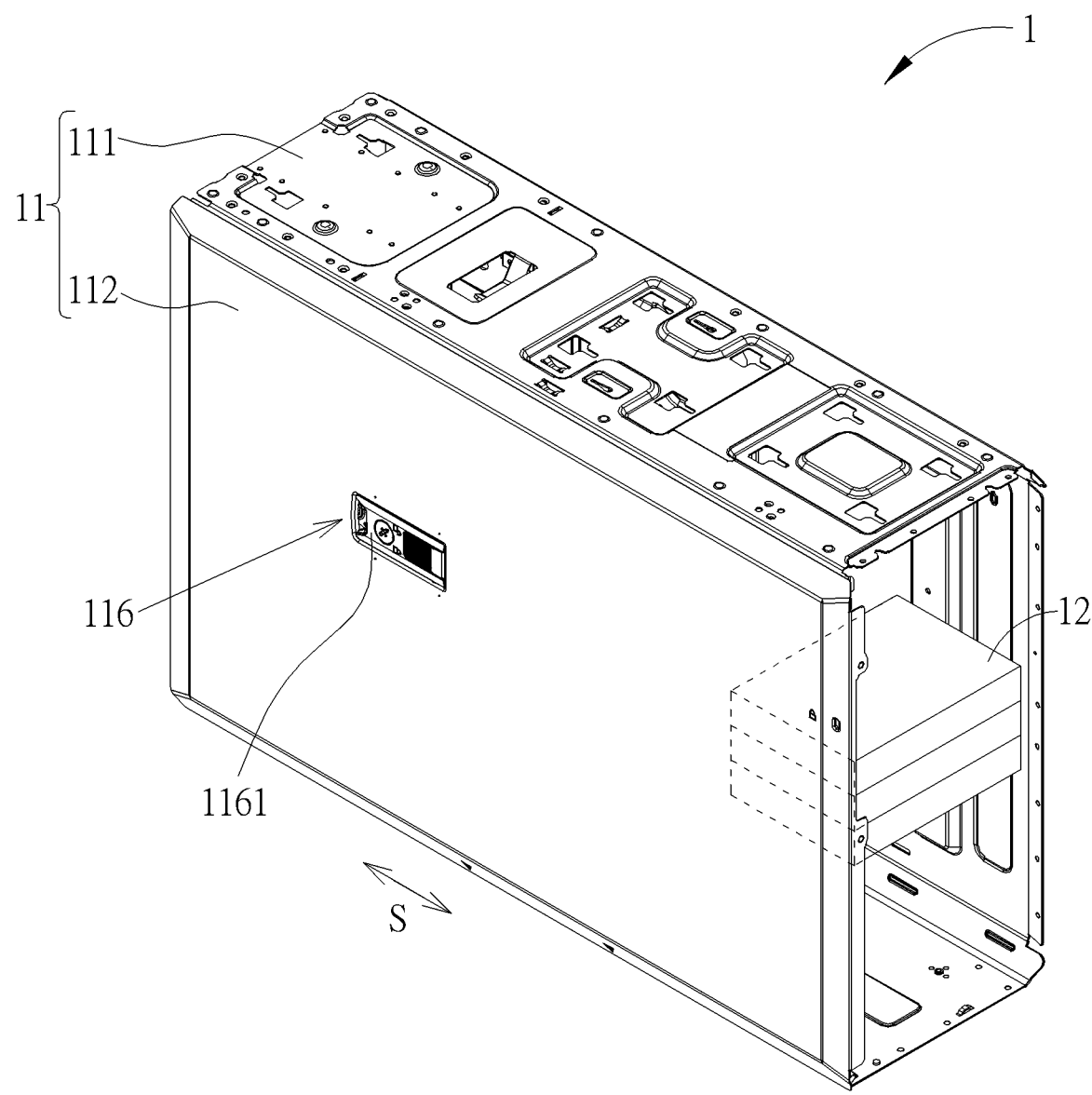
FIG. 1 is a partial diagram of an electronic device in a locking state according to a first embodiment of the present invention.
Figure 2:
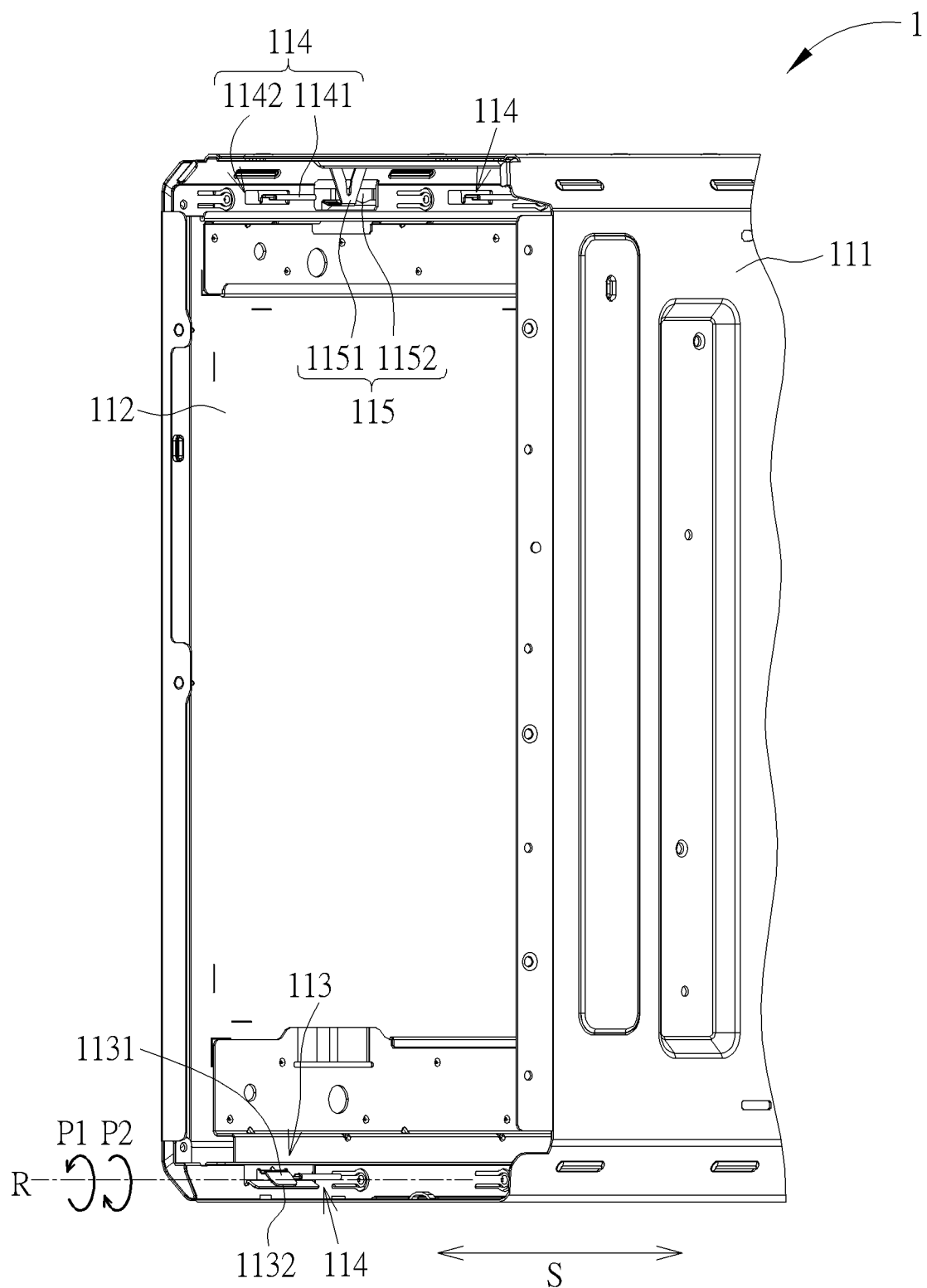
FIG. 2 is another partial diagram of the electronic device in the locking state according to the first embodiment of the present invention.
Figure 3:
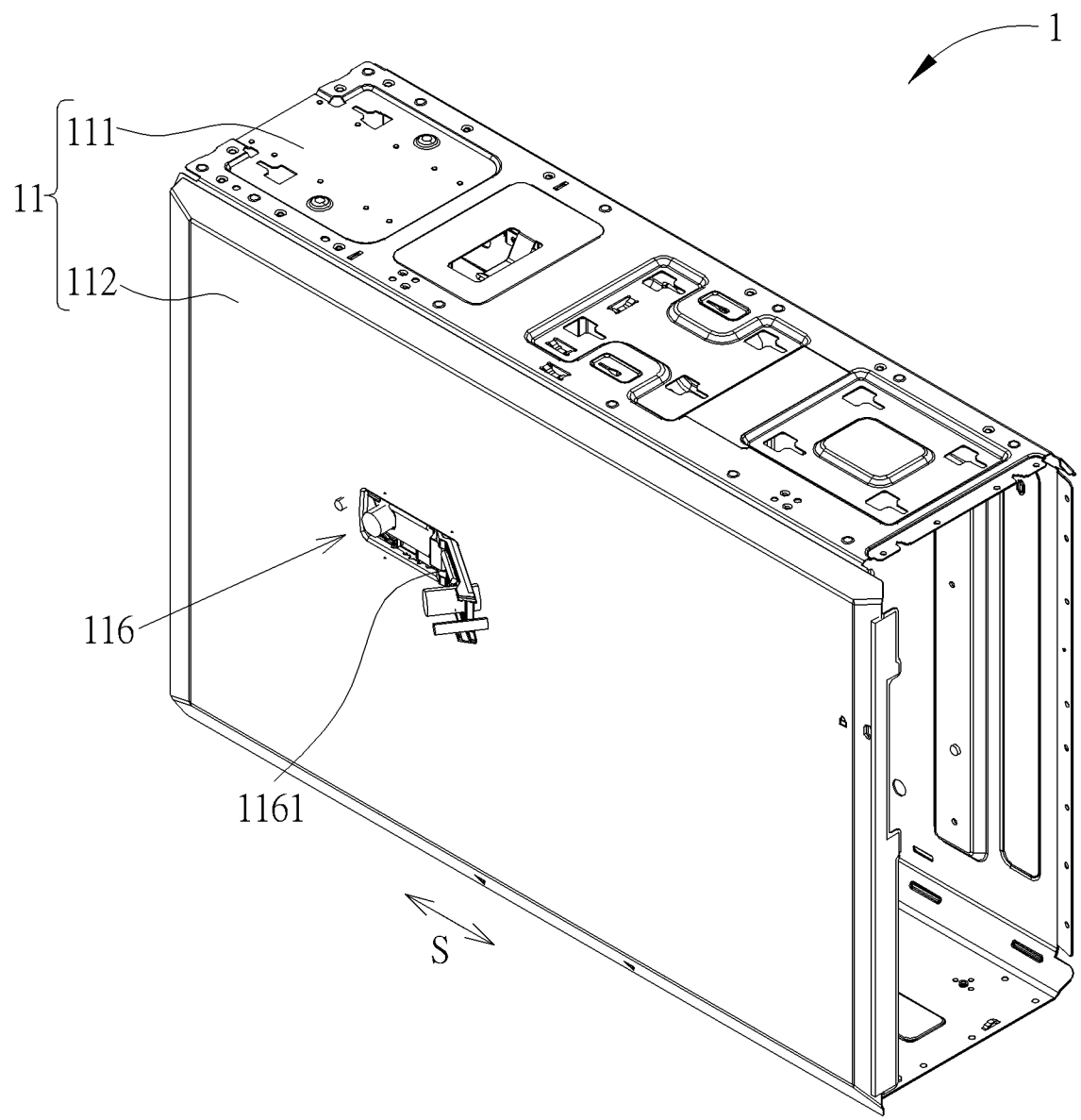
FIG. 3 is a partial diagram of the electronic device in an unlocking state according to the first embodiment of the present invention.
Figure 4:
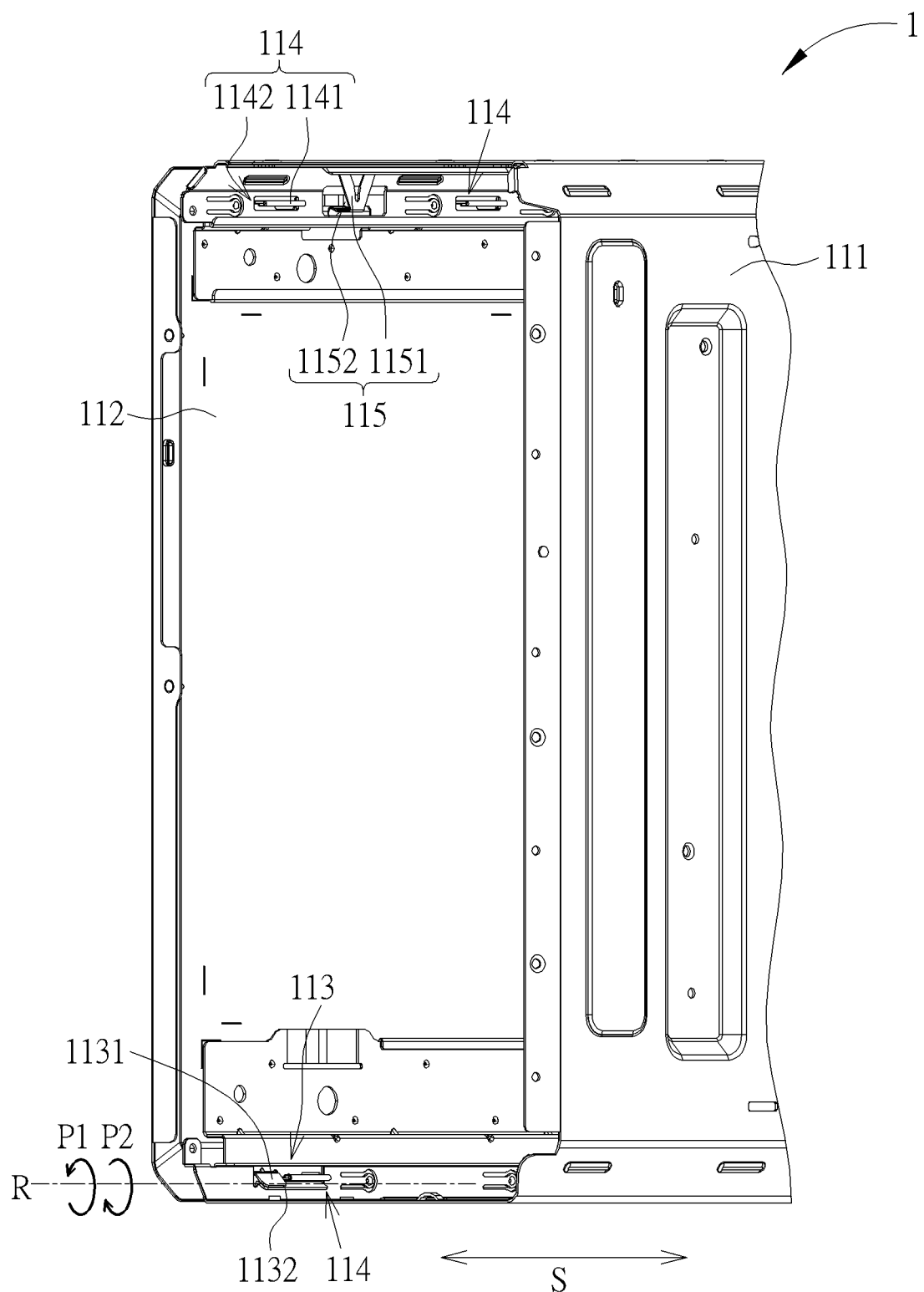
FIG. 4 is another partial diagram of the electronic device in the unlocking state according to the first embodiment of the present invention.

Please refer to FIG. 1 to FIG. 8. As shown in FIG. 1 to FIG. 8, an electronic device 1 includes a chassis structure 11 and at least one electronic module 12. The electronic module 12 is installed inside the chassis structure 11. The chassis structure 11 includes a main body 111 and a lateral plate 112. The lateral plate 112 is detachably installed on the main body 111 and switchable relative to the main body 111 between a locking position as shown in FIG. 1 and FIG. 2 and an unlocking position as shown in FIG. 3 and FIG. 4. When the lateral plate 112 is located at the unlocking position as shown in FIG. 3 and FIG. 4 relative to the main body 111, the lateral plate 112 is not restrained and can be pivotally unfolded relative to the main body 111. When the lateral plate 112 is located at the locking position as shown in FIG. 1 and FIG. 2 relative to the main body 111, the lateral plate 112 is restrained from pivoting relative to the main body 111.

Preferably, the electronic device 1 can be a server. However, the present invention is not limited thereto. For example, in another embodiment, the electronic device can be an industrial computer or a personal computer. Furthermore, the electronic module can be a storage module, such as a hard disk drive, a motherboard, a memory, a processor, a power supply unit, or any other essential component for the server, the industrial computer or the personal computer.

As shown in FIG. 1 to FIG. 4, the lateral plate 112 is slidable between the locking position and the unlocking position relative to the main body 111 along a sliding direction S. The chassis structure 11 further includes a pivoting mechanism 113. The pivoting mechanism 113 has a pivoting axis R parallel to the sliding direction S and is configured to allow the lateral plate 112 to pivot relative to the main body 111 around the pivoting axis R.

Specifically, as shown in FIG. 1 to FIG. 8, the chassis structure 11 includes a pushing structure 116. The pushing structure 116 includes an operating handle 1161 and at least one pushing component 1162. The operating handle 1161 is connected to the pushing component 1162 and movably linked to the pushing component 1162. The operating handle 1161 is pivotally disposed on the lateral plate 112. The operating handle 1161 drives the pushing component 1162 to abut against at least one corresponding pushed structure, which is not shown in the figures, of the main body 111 for driving the lateral plate 112 to slide from the locking position to the unlocking position relative to the main body 111 when the operating handle 1161 pivots relative to the lateral plate 112.

However, the present invention is not limited to this embodiment. For example, in another embodiment, the pushing structure can further include a linking component connected between the operating handle and the pushing component, and the linking component can be a linkage or a cable for driving the pushing component to abut against the pushed structure of the main body to drive the lateral plate to slide relative to the main body when the operating handle is operated to pivot. Alternatively, in another embodiment, the operating handle can be slidably disposed on the lateral plate, so that the operating component can slidably drive the pushing component to abut against the pushed structure to drive the lateral plate to slide relative to the main body.

The pivoting mechanism 113 includes at least one first bending plate 1131 disposed on the lateral plate 112 and at least one second bending plate 1132 disposed on the main body 111. Each first bending plate 1131 is disposed above the corresponding second bending plate 1132. An end of each second bending plate 1132 is configured to abut against the corresponding first bending plate 1131 to form the pivoting axis R by an abutting cooperation of each second bending plate 1132 and the corresponding first bending plate 1131 when the lateral plate 112 is located at the unlocking position as shown in FIG. 3 and FIG. 4 relative to the main body 111.

However, the present invention is not limited to this embodiment. Any mechanism which allows the lateral plate to pivot relative to the main body is included within the scope of the present invention. For example, in another embodiment, the pivoting mechanism can include a pivoting shaft and a pivoting hole respectively disposed on the lateral plate and the main body or respectively disposed on the main body and the lateral plate, and the pivoting shaft can rotatably pass through the pivoting hole for allowing the lateral plate to pivot relative to the main body when the lateral plate is located at the unlocking position relative to the main body.

Besides, the chassis structure 11 further includes a locking mechanism 114 disposed between the main body 111 and the lateral plate 112. The locking mechanism 114 is configured to restrain the lateral plate 112 from pivoting relative to the main body 111 when the lateral plate 112 is located at the locking position relative to the main body 111, and the locking mechanism 114 is further configured to allow the lateral plate 112 to pivot relative to the main body 111 when the lateral plate 112 is located at the unlocking position relative to the main body 111.

Specifically, the locking mechanism 114 includes at least one locking hook 1141 and at least one locking slot 1142. The locking hook 1141 and the locking slot 1142 are respectively disposed on lateral plate 112 and the main body 111. Each locking hook 1141 engages with the corresponding locking slot 1142 along the sliding direction S to restrain the lateral plate 112 from pivotally unfolding relative to the main body 111 around the pivoting axis R when the lateral plate 112 slides from the unlocking position to the locking position along the sliding direction S relative to the main body 111. Each locking hook 1141 disengages from the corresponding locking slot 1142 along the sliding direction S to allow the lateral plate 112 to pivotally unfold relative to the main body 111 around the pivoting axis R when the lateral plate 112 slides from the locking position to the unlocking position relative to the main body 111 along the sliding direction S.

However, the present invention is not limited to this embodiment. For example, in another embodiment, the locking mechanism can include at least one locking hook and at least one locking slot respectively disposed on the main body and the lateral plate, and the locking hook and the locking slot can engage with each other for restraining the lateral plate from pivotally unfolding relative to the main body or disengage from each other for allowing the lateral plate to pivotally unfold relative to the main body when the lateral plate slides relative to the main body. Alternatively, in another embodiment, the lateral plate can be configured to be incapable of sliding relative to the main body, and the locking mechanism can include at least one locking hook movably disposed on the lateral plate, at least one locking slot fixedly disposed on the main body and an operating component movably disposed on the lateral plate and for driving the locking hook to move. The lateral plate is allowed to pivotally unfold relative to the main body when the operating component is operated to drive the locking hook to disengage from the locking slot, i.e., the lateral plate is located at the unlocking position relative to the main body when the operating component is operated to drive the locking hook to disengage from the locking slot.

Figure 5:
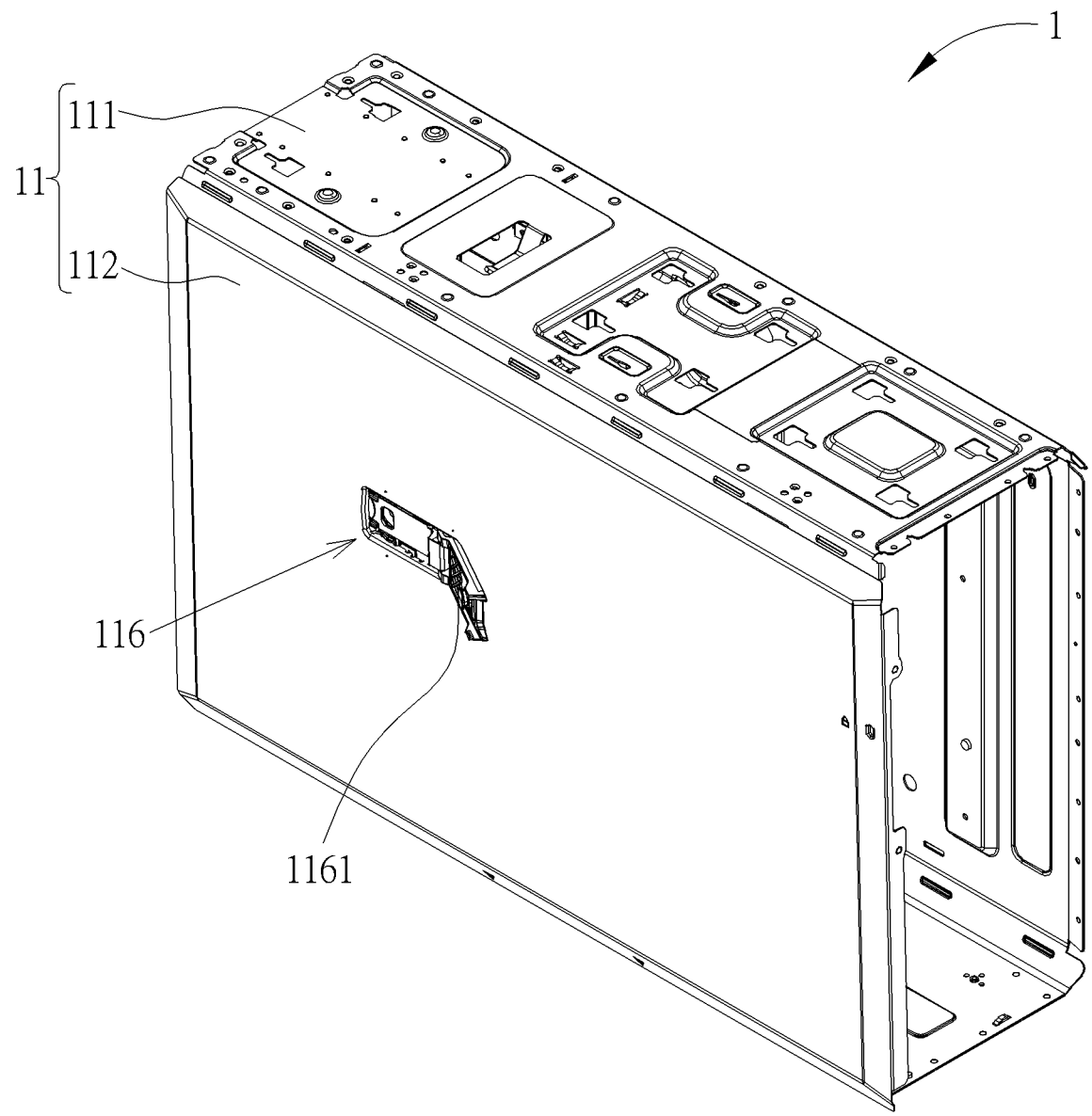
FIG. 5 is a partial diagram of the electronic device in a supporting state according to the first embodiment of the present invention.
Figure 6:
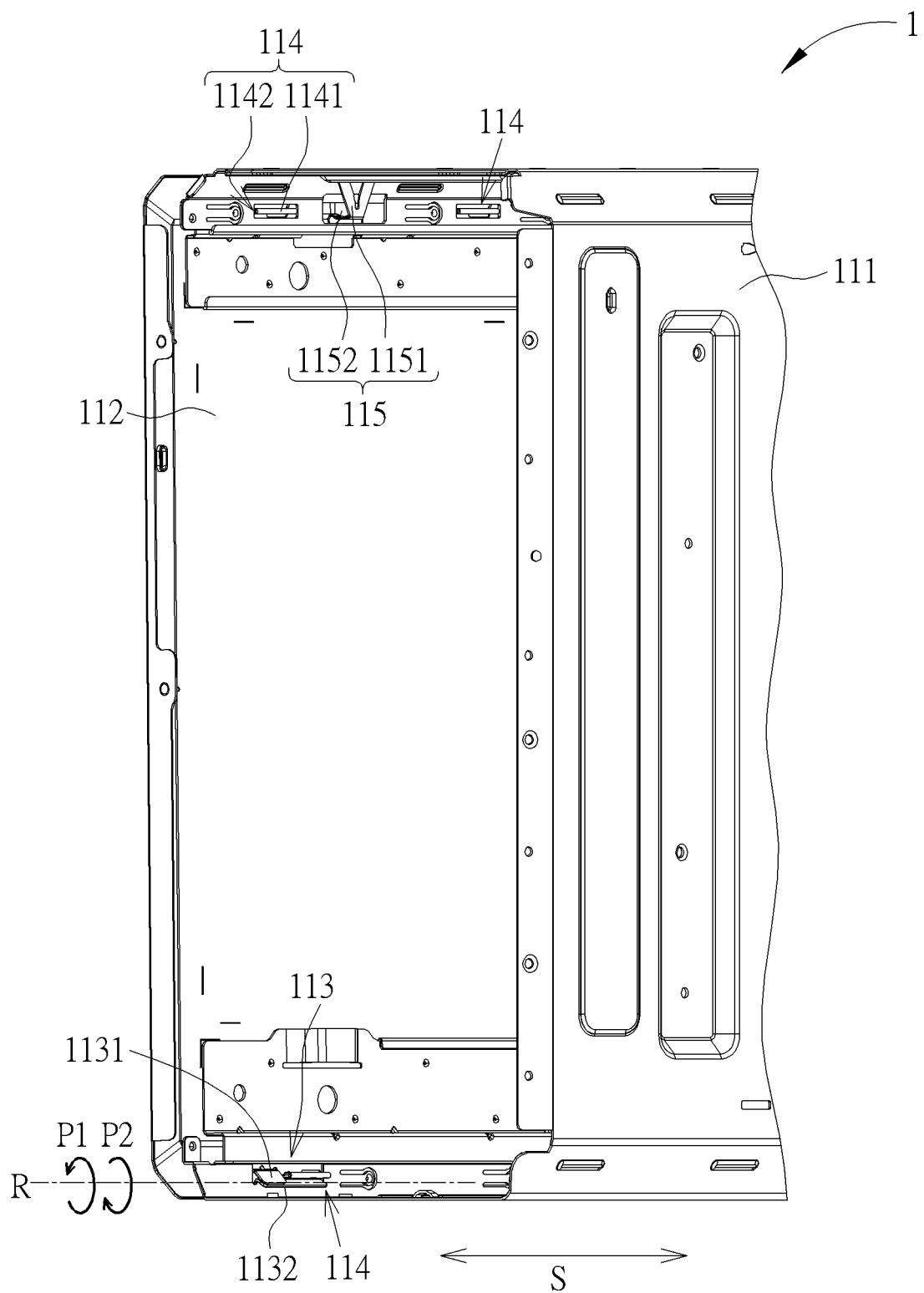
FIG. 6 is another diagram of the electronic device in the supporting state according to the first embodiment of the present invention.

Furthermore, please refer to FIG. 3 to FIG. 13. As shown in FIG. 3 to FIG. 13, the chassis structure 11 further includes a restraining mechanism 115 disposed between the main body 111 and the lateral plate 112 and for restraining a pivotal angle of the lateral plate 112 relative to the main body 111 around the pivoting axis R along a first pivoting direction P1, so as to position the lateral plate 112 at a supporting position as shown in FIG. 5 and FIG. 6 relative to the main body 111 for preventing the lateral plate 112 from falling off.

Figure 9:
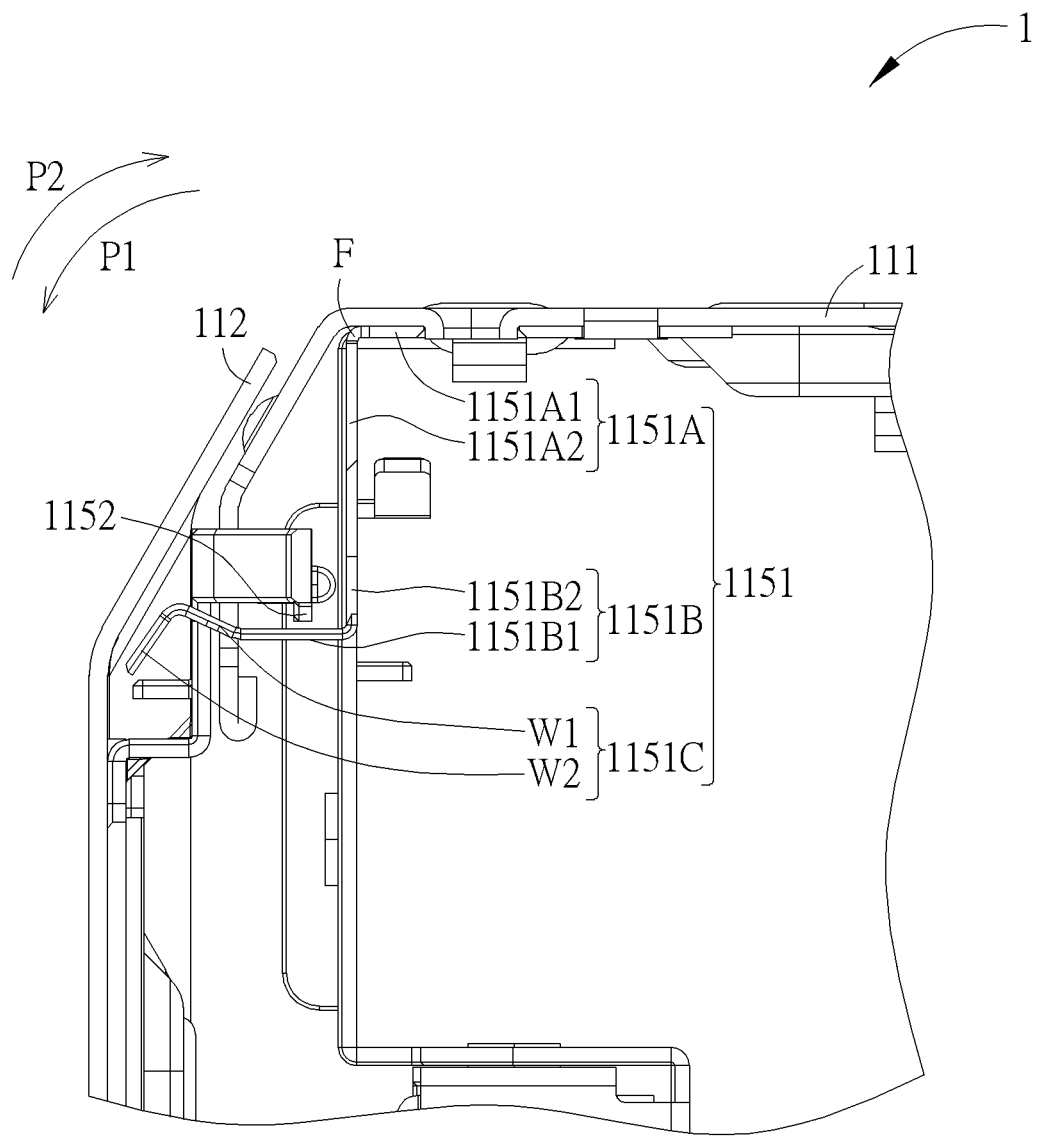
FIG. 9 to FIG. 13 are sectional diagrams of the electronic device as a lateral plate pivots to different positions relative to the main body according to the first embodiment of the present invention.
Figure 10:
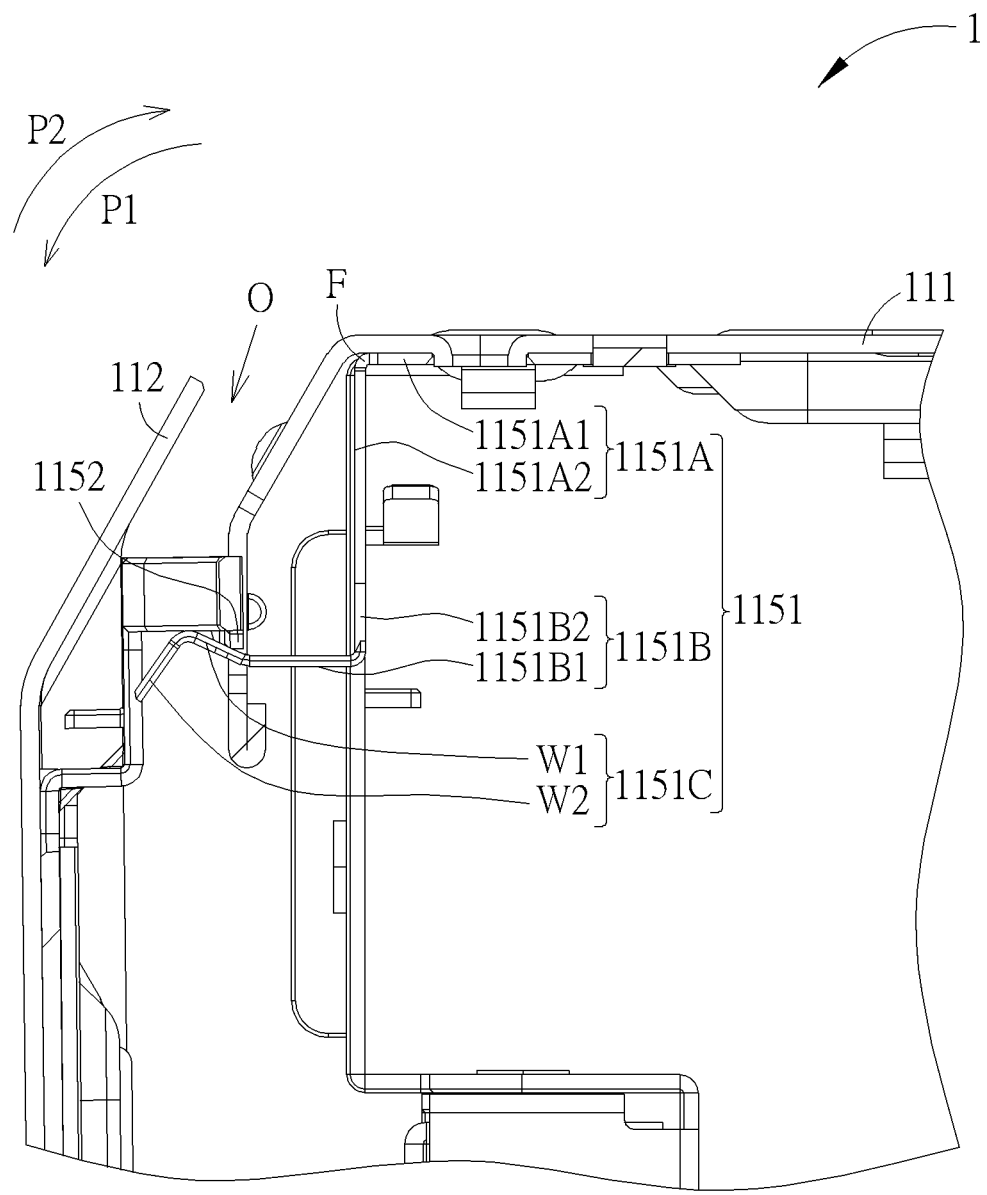

Specifically, the restraining mechanism 115 includes at least one first restraining component and at least one second restraining component. More specifically, the first restraining component and the second restraining component can respectively be a restraining hook 1151 and a restraining protrusion 1152. The restraining hook 1151 and the restraining protrusion 1152 are respectively disposed on the main body 111 and the lateral plate 112. Each restraining hook 1151 is configured to abut against the corresponding restraining protrusion 1152 for restraining the pivotal angle of the lateral plate 112 relative to the main body 111 around the pivoting axis R along the first pivoting direction P1, so as to position the lateral plate 112 at the supporting position as shown in FIG. 5, FIG. 6 and FIG. 10 relative to the main body 111. A gap O is formed between the lateral plate 112 and the main body 111 and for allowing a user's finger to insert therein when the lateral plate 112 is located at the supporting position. Each restraining protrusion 1152 pushes the corresponding restraining hook 1151 to resiliently deform the corresponding restraining hook 1151 for allowing the lateral plate 112 to pivotally pass through the supporting position when the lateral plate 112 is pivoted toward an open position as shown in FIG. 7 or a closed position as shown in FIG. 9.

Figure 7:
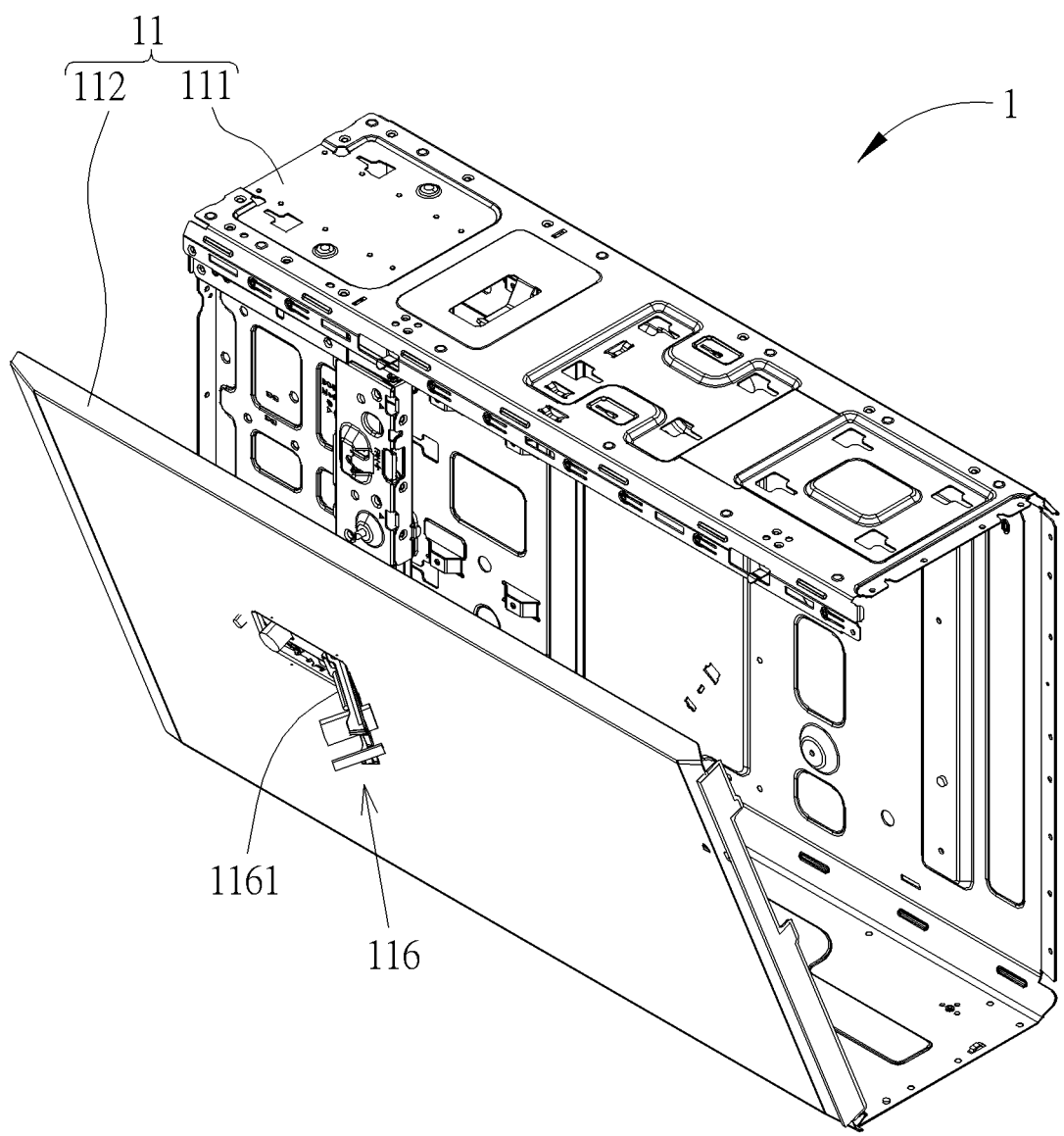
FIG. 7 is a partial diagram of the electronic device in an open state according to the first embodiment of the present invention.
Figure 8:
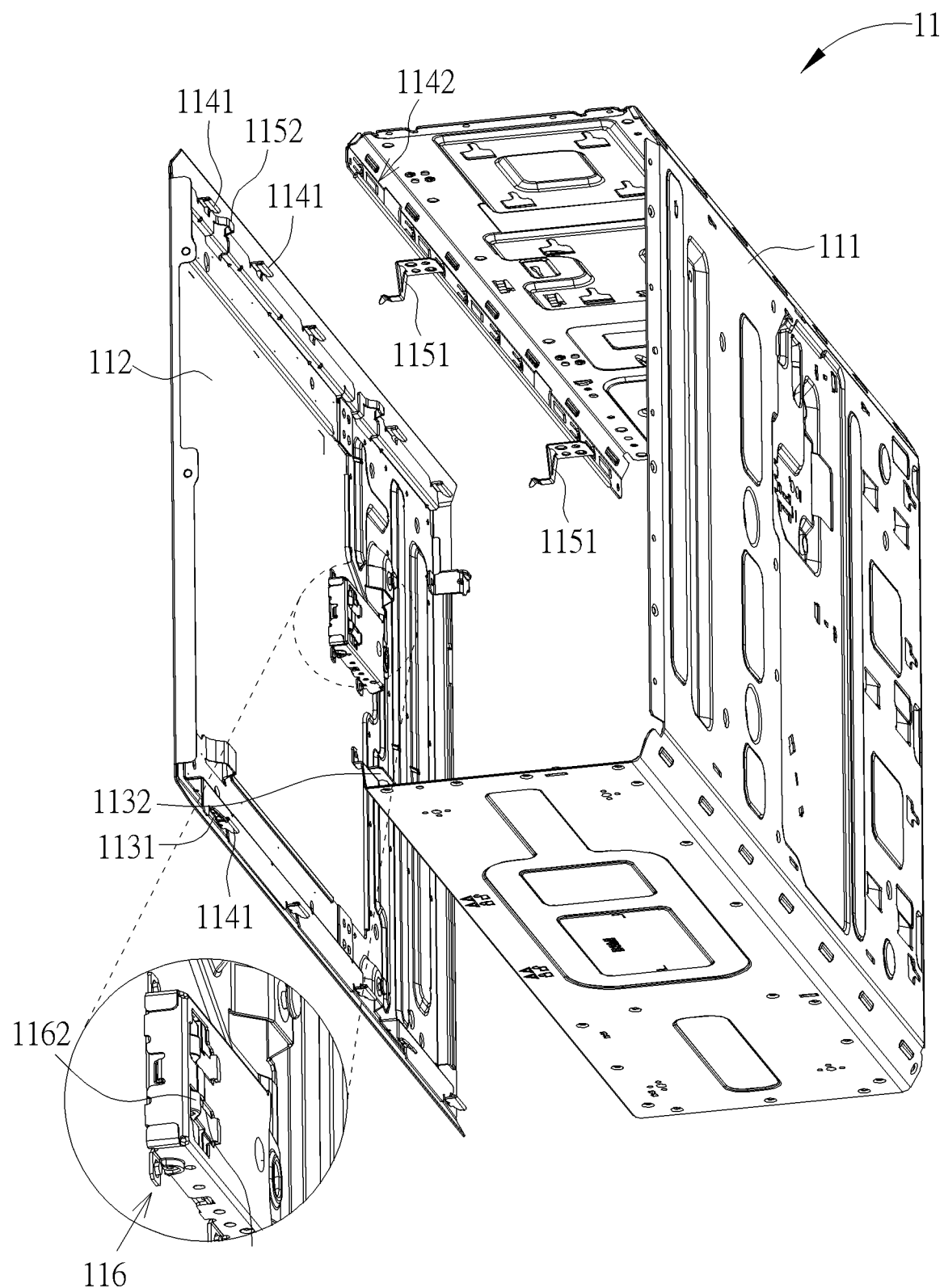
FIG. 8 is a partial exploded diagram of a chassis structure according to the first embodiment of the present invention.
Figure 12:
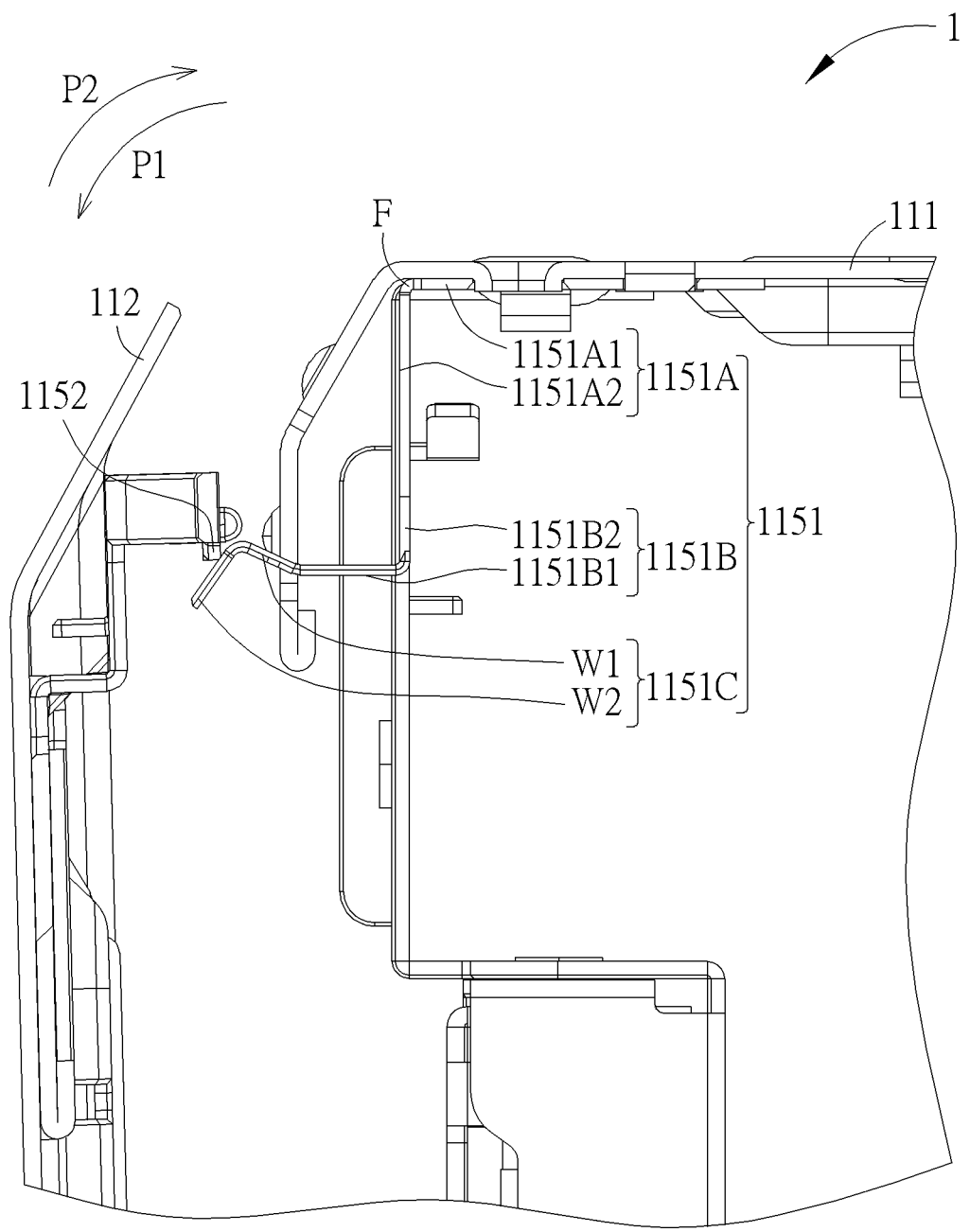

In detailed, each restraining protrusion 1152 pushes the corresponding restraining hook 1151 to resiliently deform the corresponding restraining hook 1151 for allowing the lateral plate 112 to pivot to the open position as shown in FIG. 7 through the supporting position as shown in FIG. 5, FIG. 6 and FIG. 10 along the first pivoting direction P1 when the lateral plate 112 is forced by a first torque to pivot toward the open position along the first pivoting direction P1. In other words, each restraining protrusion 1152 disengages from the corresponding restraining hook 1151 along the first pivoting direction P1 during a process that the lateral plate 112 pivots from the supporting position to the open position. Moreover, during the process that the lateral plate 112 pivots from the supporting position to the open position, the pivotal angle of the lateral plate 112 relative to the main body 111 along the first pivoting direction P1 increases gradually, and the gap O formed between the lateral plate 112 and the main body 111 increases gradually. In addition, the open position of the present invention is not limited to the one illustrated in FIG. 7. It depends on practical demands and can be adjusted by sizes and positions of the restraining hook and the restraining protrusion. As shown in FIG. 12, when the lateral plate 112 is forced by a second torque to pivot toward the closed position along a second pivoting direction P2 opposite to the first pivoting direction P1, each restraining protrusion 1152 pushes the corresponding restraining hook 1151 to resiliently deform the corresponding restraining hook 1151 for allowing the lateral plate 112 to pivot to the closed position as shown in FIG. 9, which is the same as the unlocking position as shown in FIG. 3 and FIG. 4, through the supporting position as shown in FIG. 5, FIG. 6 and FIG. 10 along the second pivoting direction P2. During a process that the lateral plate 112 pivots from the supporting position to the closed position, the pivotal angle of the lateral plate 112 relative to the main body 111 along the first pivoting direction P1 decreases gradually, and the gap O formed between the lateral plate 112 and the main body 111 decreases gradually.

Figure 11:
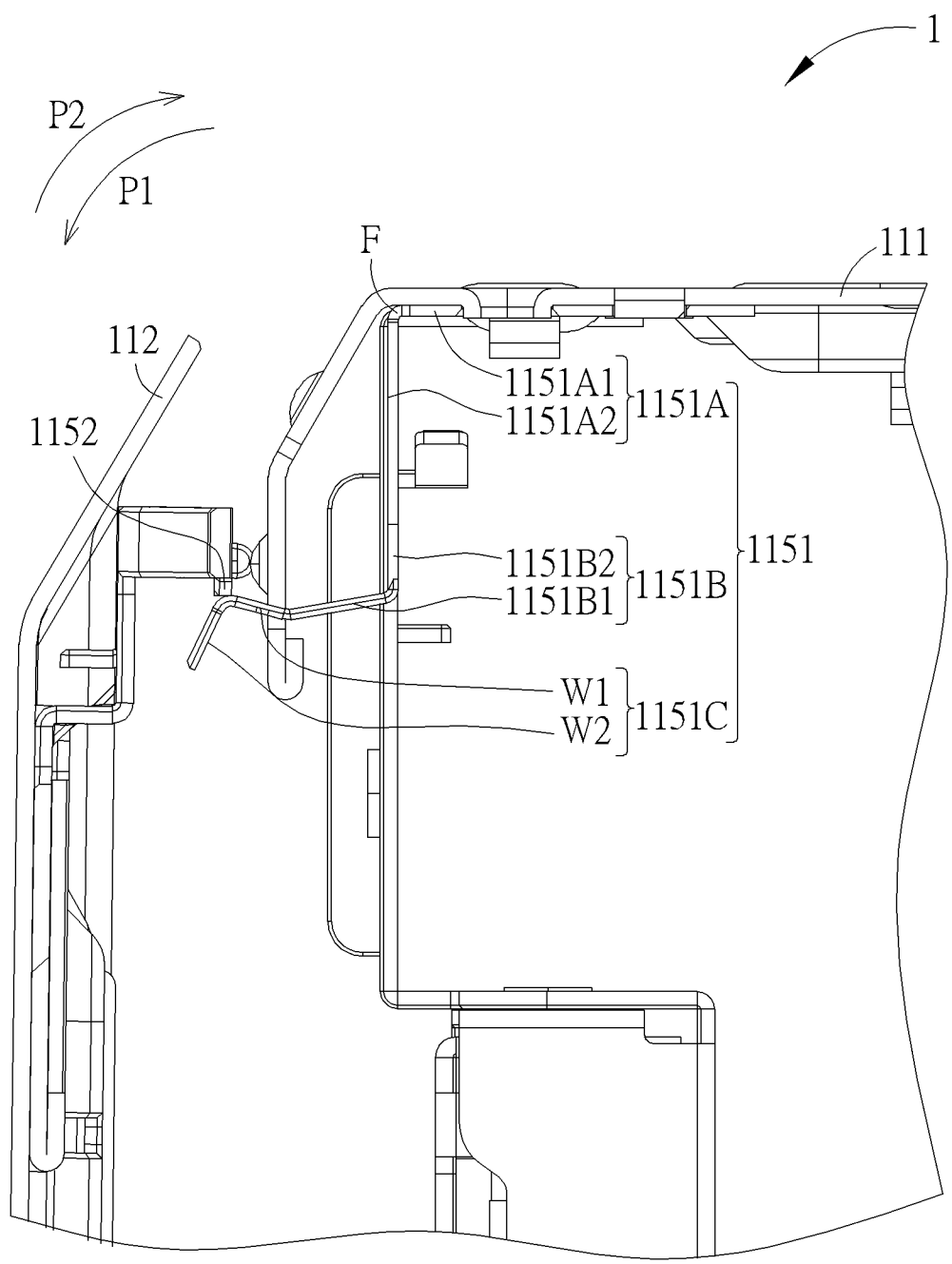

More specifically, each restraining hook 1151 includes a first resilient deformation portion 1151A, a second resilient deformation portion 1151B extending from the first resilient deformation portion 1151A and an abutting protrusion 1151C extending from the second resilient deformation portion 1151B. The first resilient deformation portion 1151A can be disposed on the main body 111 by a fastening component, such as a screw component. The abutting protrusion 1151C includes a first abutting inclined wall W1 and a second abutting inclined wall W2. An inclined direction of the second abutting inclined wall W2 is opposite to an inclined direction of the first abutting inclined wall W1. The first resilient deformation portion 1151A and the second resilient deformation portion 1151B can be made of resilient material. Each restraining protrusion 1152 can push the corresponding first abutting inclined wall W1 to resiliently deform the corresponding second resilient deformation portion 1151B along the first pivoting direction P1 for allowing the lateral plate 112 to pivot to the open position through the supporting position as shown in FIG. 5, FIG. 6 and FIG. 10 along the first pivoting direction P1 when the lateral plate 112 is forced by the first torque to pivot toward the open position along the first pivoting direction P1. As shown in FIG. 11, each restraining protrusion 1152 can push the corresponding second abutting inclined wall W2 to resiliently deform the corresponding first resilient deformation portion 1151A along the first pivoting direction P1 for allowing the lateral plate 112 to pivot to the closed position as shown in FIG. 9, which is the same as the unlocking position as shown in FIG. 3 and FIG. 4, through the supporting position as shown in FIG. 5, FIG. 6 and FIG. 10 along the first pivoting direction P1 when the lateral plate 112 is forced by the second torque to pivot toward the closed position along the second pivoting direction P2.

Preferably, each first resilient deformation portion 1151A and the corresponding second resilient deformation portion 1151B are in a point symmetry arrangement relative to a connection of each first resilient deformation portion 1151A and the corresponding second resilient deformation portion 1151B, i.e., positions of each first resilient deformation portion 1151A and the corresponding second resilient deformation portion 1151B can substantially coincide with each other when each first resilient deformation portion 1151A rotates around the connection of the each first resilient deformation portion 1151A and the corresponding second resilient deformation portion 1151B by 180 degrees. Each first resilient deformation portion 1151A and the corresponding second resilient deformation portion 1151B are L-shaped structures. Each first resilient deformation portion 1151A includes a first part 1151A1 and a second part 1151A2. Each second resilient deformation portion 1151B includes a third part 1151B1 and a fourth part 1151B2. Each first part 1151A1 is disposed on the main body 111. Each second part 1151A2 extends from the corresponding first part 1151A1 and is connected to the corresponding fourth part 1151B2. Each third part 1151B1 extends from the corresponding fourth part 1151B2. Each abutting protrusion 1151C extends from the corresponding third part 1151B1. Besides, a fulcrum F is formed on each first resilient deformation portion 1151A and located at a connection of the corresponding first part 1151A1 and the corresponding second part 1151A2. When the lateral plate 112 is forced by the first torque to pivot toward the open position along the first pivoting direction P1 to drive each restraining protrusion 1152 to push the corresponding first abutting inclined wall W1, a first acting force acting on the corresponding first abutting inclined wall W1 by each restraining protrusion 1152 passes through the corresponding fulcrum F but does not pass through a connection of the corresponding third part 1151B1 and the corresponding fourth part 1151B2, i.e., a torque generated by the first acting force acting on the corresponding first abutting inclined wall W1 by each restraining protrusion 1152 relative to the corresponding fulcrum F is less than a torque generated by the first acting force acting on the corresponding first abutting inclined wall W1 by each restraining protrusion 1152 relative to the connection of the corresponding third part 1151B1 and the corresponding fourth part 1151B2. In such a way, the connection of the corresponding third part 1151B1 and the corresponding fourth part 1151B2 can be resiliently deformed by the first acting force acting on the corresponding first abutting inclined wall W1 by each restraining protrusion 1152, i.e., an included angle included between the corresponding third part 1151B1 and the corresponding fourth part 1151B2 can resiliently change. When the lateral plate 112 is forced by the second torque to pivot toward the closed position along the second pivoting direction P2 to drive each restraining protrusion 1152 to push the corresponding second abutting inclined wall W2, a second acting force acting on the corresponding second abutting inclined wall W2 by each restraining protrusion 1152 passes through neither the corresponding fulcrum F nor the connection of the corresponding third part 1151B1 and the corresponding fourth part 1151B2. However, a moment arm of the second acting force acting on the corresponding second abutting inclined wall W2 by each restraining protrusion 1152 relative to the corresponding fulcrum F is greater than a moment arm of the second acting force acting on the corresponding second abutting inclined wall W2 by each restraining protrusion 1152 relative to the connection of the corresponding third part 1151B1 and the corresponding fourth part 1151B2. Therefore, a torque generated by the second acting force acting on the corresponding second abutting inclined wall W2 by each restraining protrusion 1152 relative to the corresponding fulcrum F is greater than a torque generated by the second acting force acting on the corresponding second abutting inclined wall W2 by each restraining protrusion 1152 relative to the connection of the corresponding third part 1151B1 and the corresponding fourth part 1151B2. In such a way, the connection of the corresponding first part 1151A1 and the corresponding second part 1151A2 can be resiliently deformed by the second acting force acting on the corresponding second abutting inclined wall W2 by each restraining protrusion 1152, i.e., an included angle included between the corresponding first part 1151A1 and the corresponding second part 1151A2 can resiliently change.

However, the present invention is not limited to this embodiment. Any mechanism which utilizes the second restraining component to resiliently deform the first restraining component for allowing the lateral plate to pivot between the closed position and the open position by resilient deformation of the first restraining component is included within the scope of the present invention. For example, in another embodiment, each first resilient deformation portion and the corresponding second resilient deformation portion can be configured to be unsymmetrical to each other, and the first acting force acting on the corresponding first abutting inclined wall by each restraining protrusion and the second acting force acting on the second abutting inclined wall by each restraining protrusion can be configured to not pass through the fulcrum of the corresponding first resilient deformation portion. Alternatively, in another embodiment, the second resilient deformation portion of the restraining hook can include a movable component and a resilient component. The movable component is pivotally connected to the first resilient deformation portion. The resilient component is connected between the movable component and the first resilient deformation portion. When the lateral plate is forced by the first torque to pivot toward the open position along the first pivoting direction to drive the restraining protrusion to abut against the first abutting inclined wall, the movable component is driven to pivot relative to the first resilient deformation portion for resiliently deforming the resilient component and allowing the lateral plate to pivot to the open position along the first pivoting direction. Alternatively, in another embodiment, the restraining mechanism can include at least one restraining hook and at least one restraining protrusion respectively disposed on the lateral plate and the main body. Alternatively, in another embodiment, the first restraining component and the second restraining component can respectively be a restraining resilient arm and a restraining hook.

Detailed description for the operational principle of the present invention is provided as follows. When it is desired to detach the lateral plate 112 from the main body 111, the user can slide the lateral plate 112 from the locking position as shown in FIG. 1 and FIG. 2 to the unlocking position as shown in FIG. 3 and FIG. 4 along the sliding direction S, so as to drive the locking hook 1141 and the locking slot 1142 to disengage from each other along the sliding direction S and to drive the first bending plate 1131 and the second bending plate 1132 to be aligned with each other. At this moment, if there is no external force applied on the lateral plate 112, the lateral plate 112 can be driven by gravity to pivotally unfold relative to the main body 111 around the pivoting axis R along the first pivoting direction P1 by the cooperation of the first bending plate 1131 and the second bending plate 1132. During the aforementioned pivotal unfolding process, as shown in FIG. 9 and FIG. 10, the first abutting inclined wall W1 can abut against the restraining protrusion 1152 for restraining the pivotal angle of the lateral plate 112 relative to the main body 111 along the first pivoting direction P1, and therefore, the lateral plate 112 can be positioned at the supporting position as shown in FIG. 5, FIG. 6 and FIG. 10 relative to the main body 111. When the lateral plate 112 is positioned at the supporting position as shown in FIG. 5, FIG. 6 and FIG. 10 relative to the main body 111, the user can further apply the first torque along the first pivoting direction P1 on the lateral plate 112. As shown in FIG. 10 and FIG. 11, when the lateral plate 112 is forced by the first torque to pivot toward the open position along the first pivoting direction P1, the restraining protrusion 1152 can push the corresponding first abutting inclined wall W1 to resiliently deform the corresponding second resilient deformation 1151B along the first pivoting direction P1 for allowing the lateral plate 112 to pivot to the open position through the supporting position as shown in FIG. 5, FIG. 6 and FIG. 10 along the first pivoting direction P1, so as to accomplish detachment of the lateral plate 112.

During the aforementioned detachment process, the lateral plate 112 can be positioned at the supporting position unless the user applies the first torque on the lateral plate 112. Therefore, the present invention can not only effectively prevent the lateral plate 112 from falling off and but also prevent damage of devices or injury of personnel caused by the falling lateral plate 112 during the detachment process. Besides, when the lateral plate 112 is positioned at the supporting position, the gap O is formed between an upper side of the lateral plate 112 and an upper side of the main body 111 for insertion of the user's finger. Therefore, it is easy for the user to insert the finger into the gap O to hold the upper side of the lateral plate 112 to apply the first torque on the lateral plate 112. Furthermore, during a process that the user operates the lateral plate 112 to pivot the lateral plate 112 to the open position along the first pivoting direction P1, the second resilient deformation portion 1151B can resiliently recover, i.e., the included angle included between the corresponding third part 1151B1 and the corresponding fourth part 1151B2 can resiliently recover, once the restraining protrusion 1152 does not push the restraining hook 1151.

Figure 13:
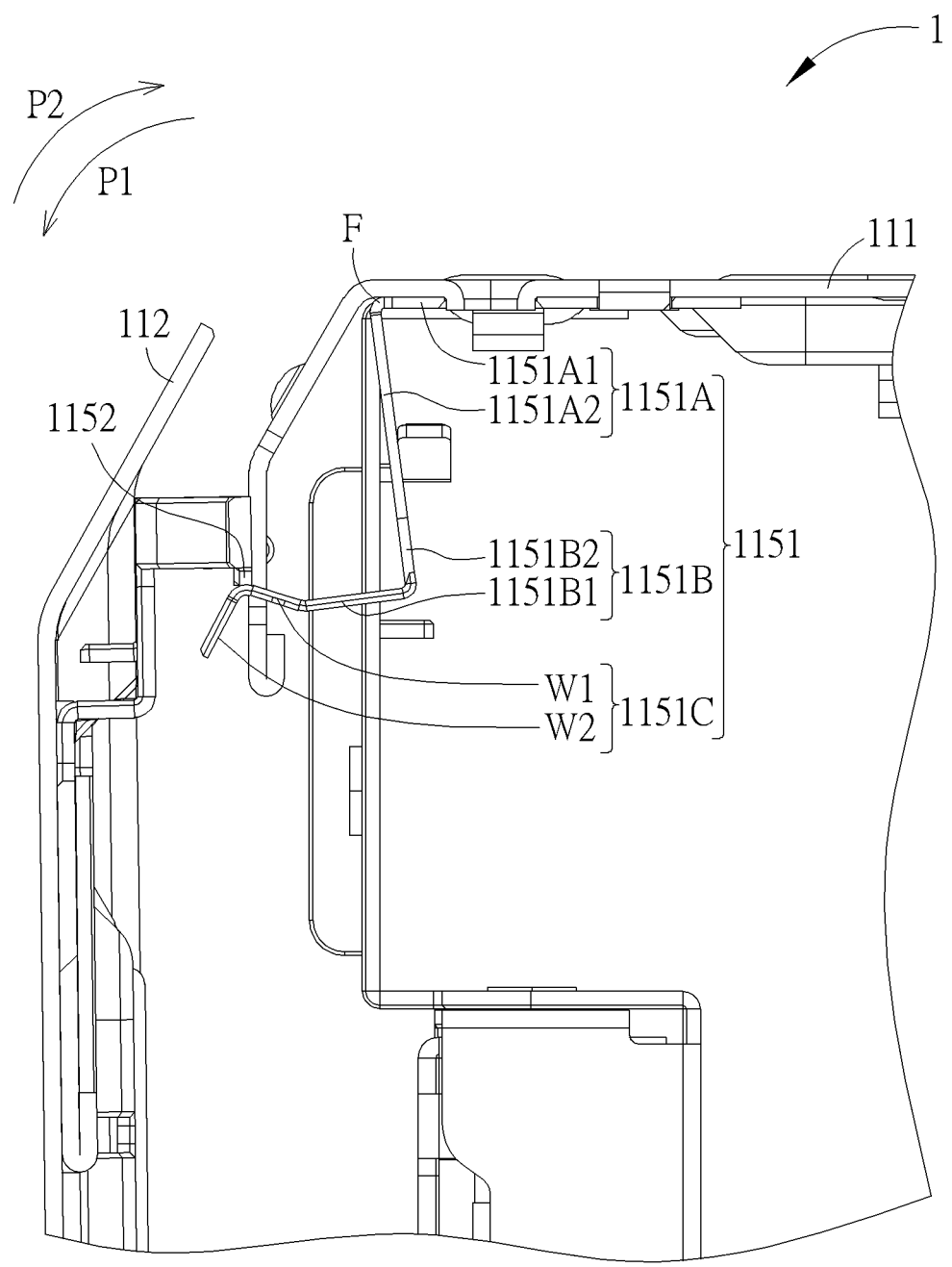
Figure 14:
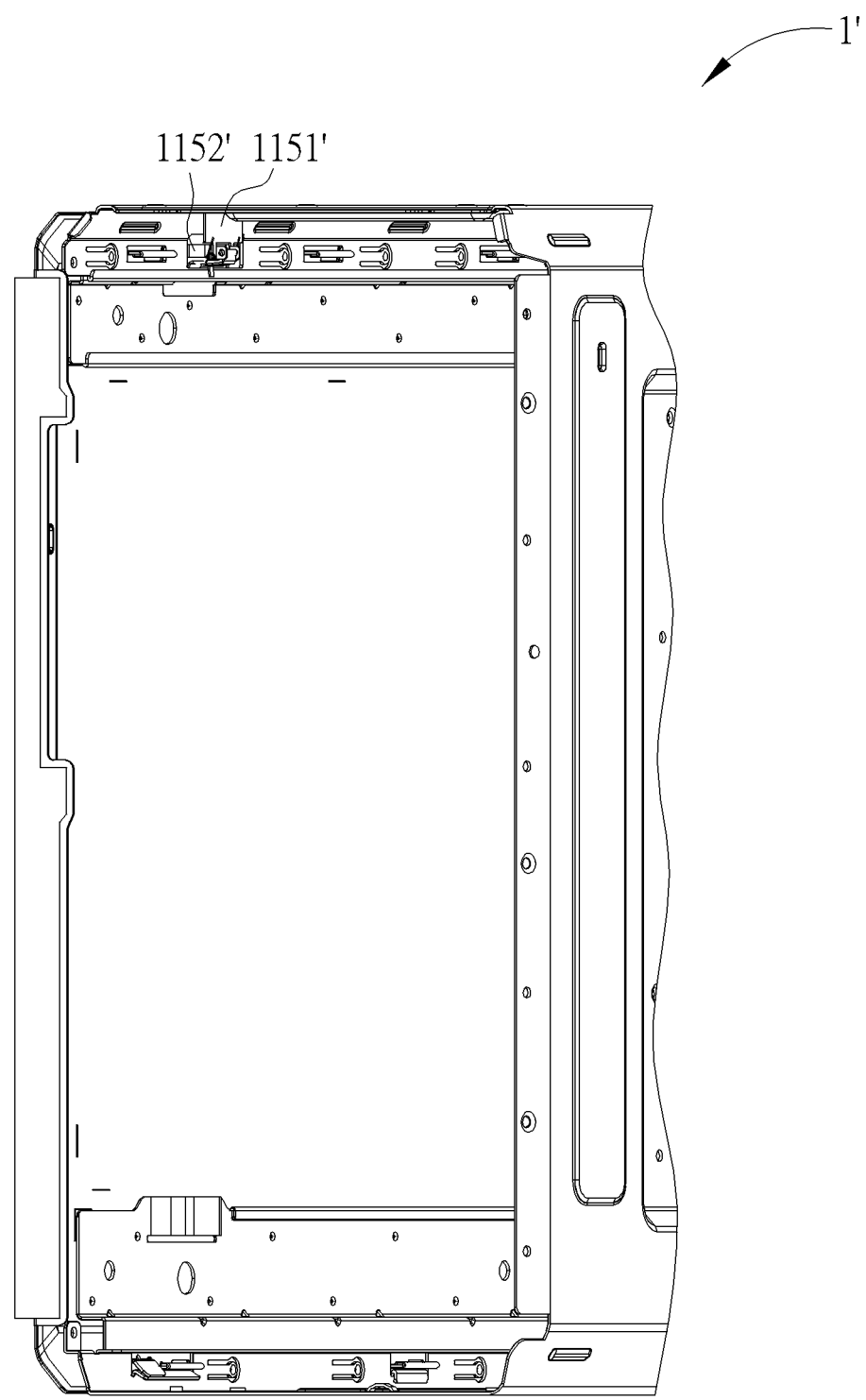
FIG. 14 is a partial diagram of an electronic device according to a second embodiment of the present invention.

On the other hand, when it is desired to install the lateral plate 112 on the main body 111, the user can apply the second torque along the second pivoting direction P2 on the lateral plate 112. As shown in FIG. 12 and FIG. 13, when the lateral plate 112 is forced by the second torque to pivot toward the closed position along the second pivoting direction P2, the restraining protrusion 1152 can push the corresponding second abutting inclined wall W2 to resiliently deform the corresponding first resilient deformation portion 1151A along the first pivoting direction P1 for allowing the lateral plate 112 to pivot to the closed position as shown in FIG. 9, which is the same as the unlocking position shown in FIG. 0.3 and FIG. 4, through the supporting position as shown in FIG. 5, FIG. 6 and FIG. 10 along the second pivoting direction P2. When the lateral plate 112 pivots to the closed position as shown in FIG. 9, which is the same as the unlocking position shown in FIG. 3 and FIG. 4, the user can further operate the lateral plate 112 to slide the lateral plate 112 relative to the main body 111 to the locking position as shown in FIG. 1 and FIG. 2 along the sliding direction S for driving the locking hook 1141 to engage with the locking slot 1142 along the sliding direction S, so as to accomplish installation of the lateral plate 112.

During the aforementioned installation process, the lateral plate 112 can be positioned at the supporting position even when an accident occurs, e.g., when the user releases the lateral plate 112 at the closed position. Therefore, the present invention cannot only effectively prevent the lateral plate 112 from falling off and but also prevent damage of devices or injury of personnel caused by the falling lateral plate 112 during the installation process. Furthermore, during a process that the user operates the lateral plate 112 to pivot the lateral plate 112 to the closed position along the second pivoting direction P2, the first resilient deformation portion 1151A can resiliently recover, i.e., the included angle included between the corresponding first part 1151A1 and the corresponding second part 1151A2 can resiliently recover, once the restraining protrusion 1152 does not push the restraining hook 1151.

Please further refer to FIG. 14 to FIG. 19. As shown in FIG. 14 to FIG. 19, different from the first embodiment, a second resilient deformation portion 1151B' of each restraining hook 1151' of an electronic device 1' includes a movable component 1151B1' and a resilient component 1151B2'. The movable component 1151B1' of each second resilient deformation portion 1151B' is pivotally connected to a corresponding first resilient deformation portion 1151A % The resilient component 1151B2' of each second resilient deformation portion 1151B' is connected between the corresponding movable component 1151B1' and the corresponding first resilient deformation portion 1151A'. An abutting protrusion 1151C' of each restraining hook 1151' extends from the corresponding movable component 1151B1'. Other structures of this embodiment are similar to those of the first embodiment. Detailed description is omitted herein for simplicity. In this embodiment, the first resilient deformation 1151A' can be made of resilient material. The movable component 1151B1' can be made of rigid material. The resilient component 1151B2' can be a torsional spring. However, the present invention is not limited thereto. For example, in another embodiment, the first resilient deformation portion and the movable component can be made of resilient material.

Figure 15:
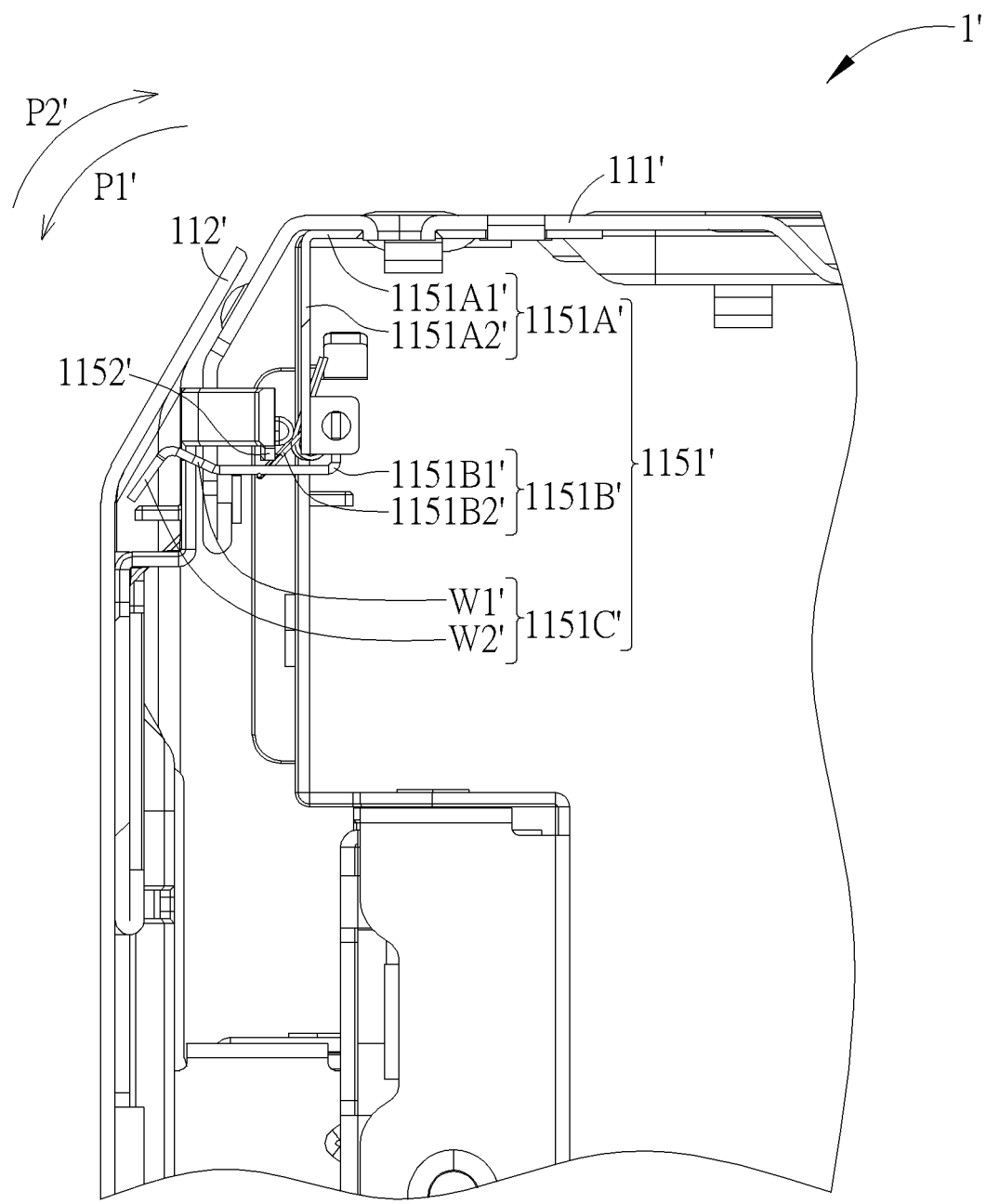
FIG. 15 to FIG. 19 are sectional diagrams of the electronic device as a lateral plate pivots to different positions relative to the main body according to the second embodiment of the present invention.

When it is desired to detach a lateral plate 112' from a main body 111', the user can slide the lateral plate 112' to the unlocking position along the sliding direction, so as to drive the locking hook and the locking slot to disengage from each other along the sliding direction and to drive the first bending plate and the second bending plate to be aligned with each other. At this moment, if there is no external force applied on the lateral plate 112', the lateral plate 112' can be driven by gravity to pivotally unfold relative to the main body 111' around the pivoting axis along a first pivoting direction P1' by the cooperation of the first bending plate and the second bending plate. During the aforementioned pivotal unfolding process, a first abutting inclined wall W1' can abut against a restraining protrusion 1152' for restraining the pivotal angle of the lateral plate 112' relative to the main body 111' along the first pivoting direction P1', and therefore, the lateral plate 112' can be positioned at the supporting position as shown in FIG. 15 relative to the main body 111'. When the lateral plate 112' is positioned at the supporting position as shown in FIG. 15 relative to the main body 111', the user can further apply the first torque along the first pivoting direction P1' on the lateral plate 112'. As shown in FIG. 15, when the lateral plate 112' is forced by the first torque to pivot toward the open position along the first pivoting direction P1', the restraining protrusion 1152' can push the corresponding first abutting inclined wall W1'. At this moment, since a torque generated by a first acting force acting on the corresponding first abutting inclined wall W1' by each restraining protrusion 1152' relative to the corresponding fulcrum is less than a torque generated by the first acting force acting on the corresponding first abutting inclined wall W1' by each restraining protrusion 1152' relative to a movable connection of the corresponding movable component 1151B1' and the corresponding first resilient deformation portion 1151A', the first acting force acting on the corresponding first abutting inclined wall W1' by each restraining protrusion 1152' can drive the corresponding movable component 1151B1' to pivot along the first pivoting direction P1' to resiliently deform the corresponding resilient component 1151B2' for allowing the lateral plate 112' to pivot to the open position through the supporting position as shown in FIG. 15 along the first pivoting direction P1', so as to accomplish detachment of the lateral plate 112'.

During the aforementioned detachment process, the lateral plate 112' can be positioned at the supporting position unless the user applies the first torque on the lateral plate 112'. Therefore, the present invention can not only effectively prevent the lateral plate 112' from falling off and but also prevent damage of devices or injury of personnel caused by the falling lateral plate 112' during the detachment process. Besides, when the lateral plate 112' is positioned at the supporting position, a gap O' is formed between an upper side of the lateral plate 112' and an upper side of the main body 111' for insertion of the user's finger. Therefore, it is easy for the user to insert the finger into the gap O' to hold the upper side of the lateral plate 112' to apply the first torque on the lateral plate 112'. Furthermore, during a process that the user operates the lateral plate 112' to pivot the lateral plate 112' to the open position along the first pivoting direction P1', the second resilient deformation portion 1151B' can resiliently recover, i.e., the included angle included between the corresponding movable component 1151B1' and the corresponding first resilient deformation portion 1151A' can resiliently recover, once the restraining protrusion 1152' does not push the restraining hook 1151'.

Figure 16:
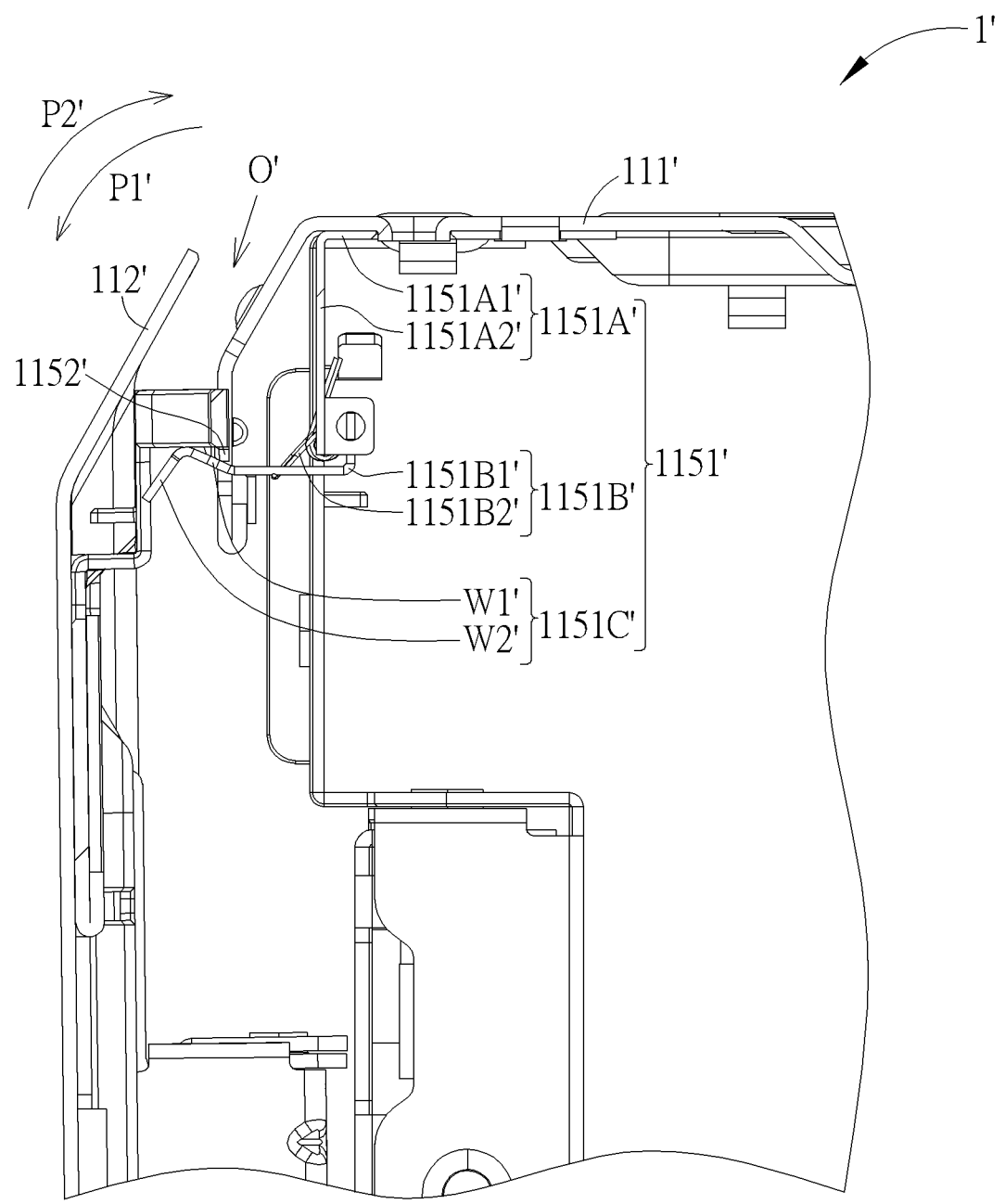
Figure 17:
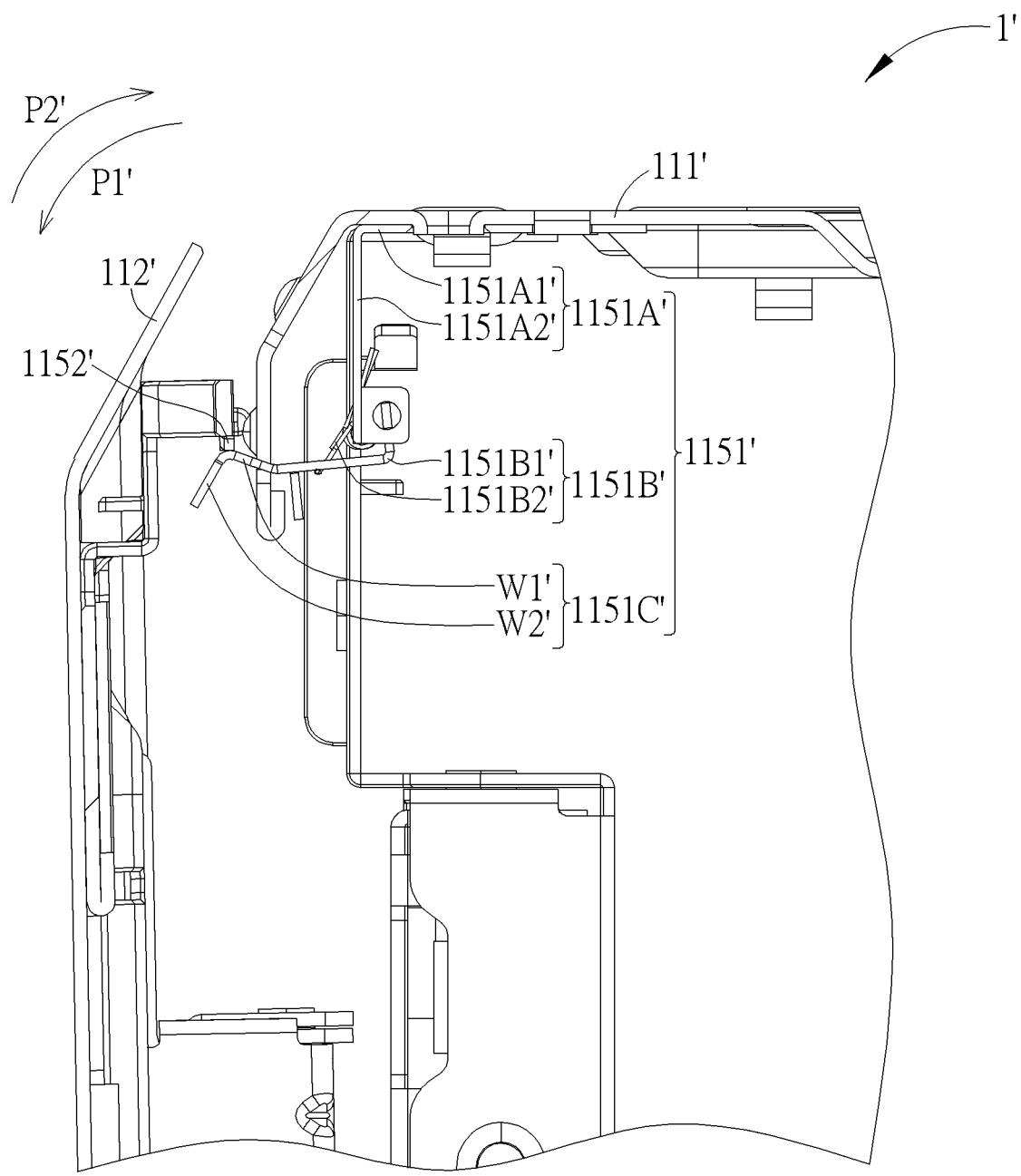
Figure 18:
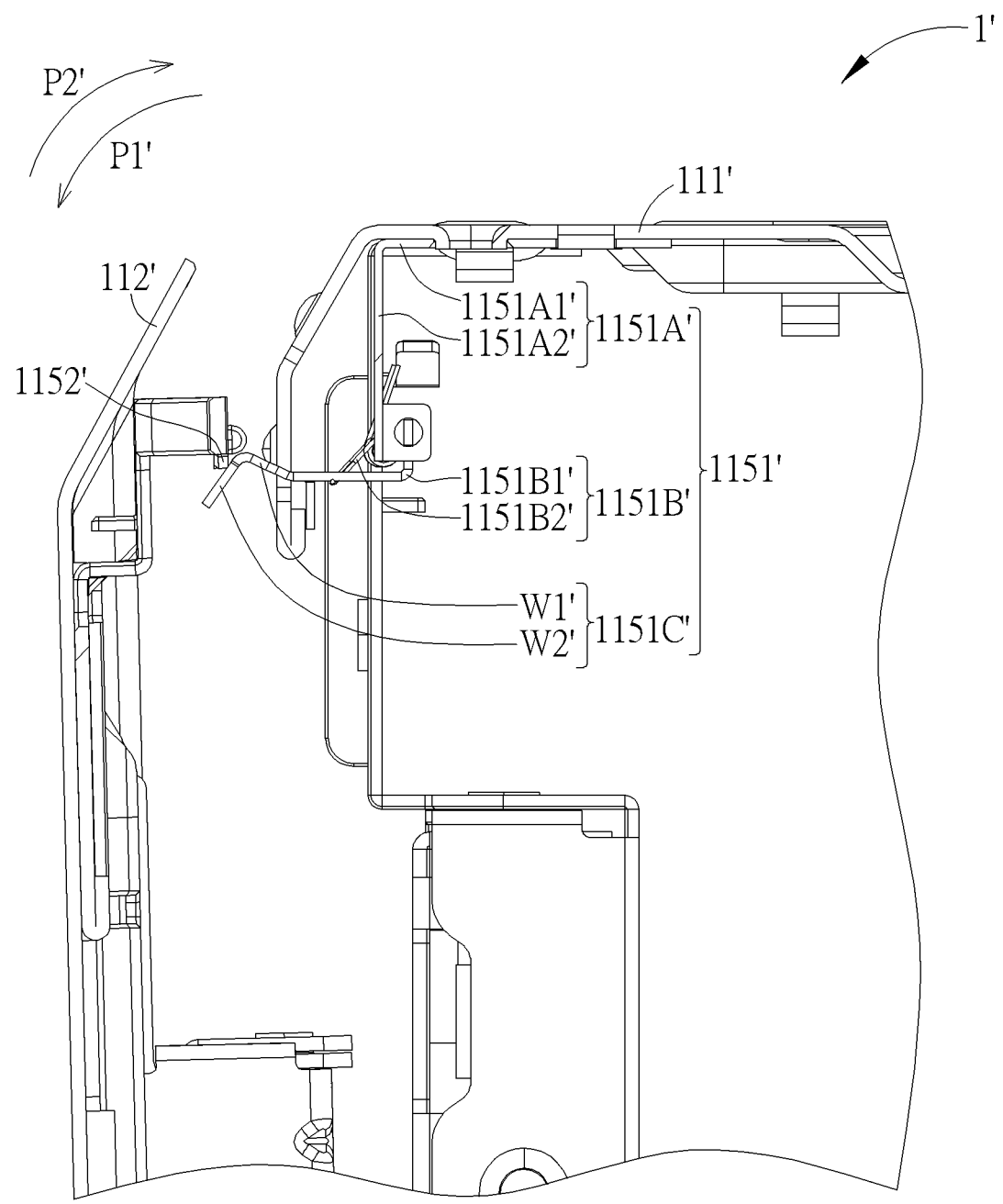
Figure 19:
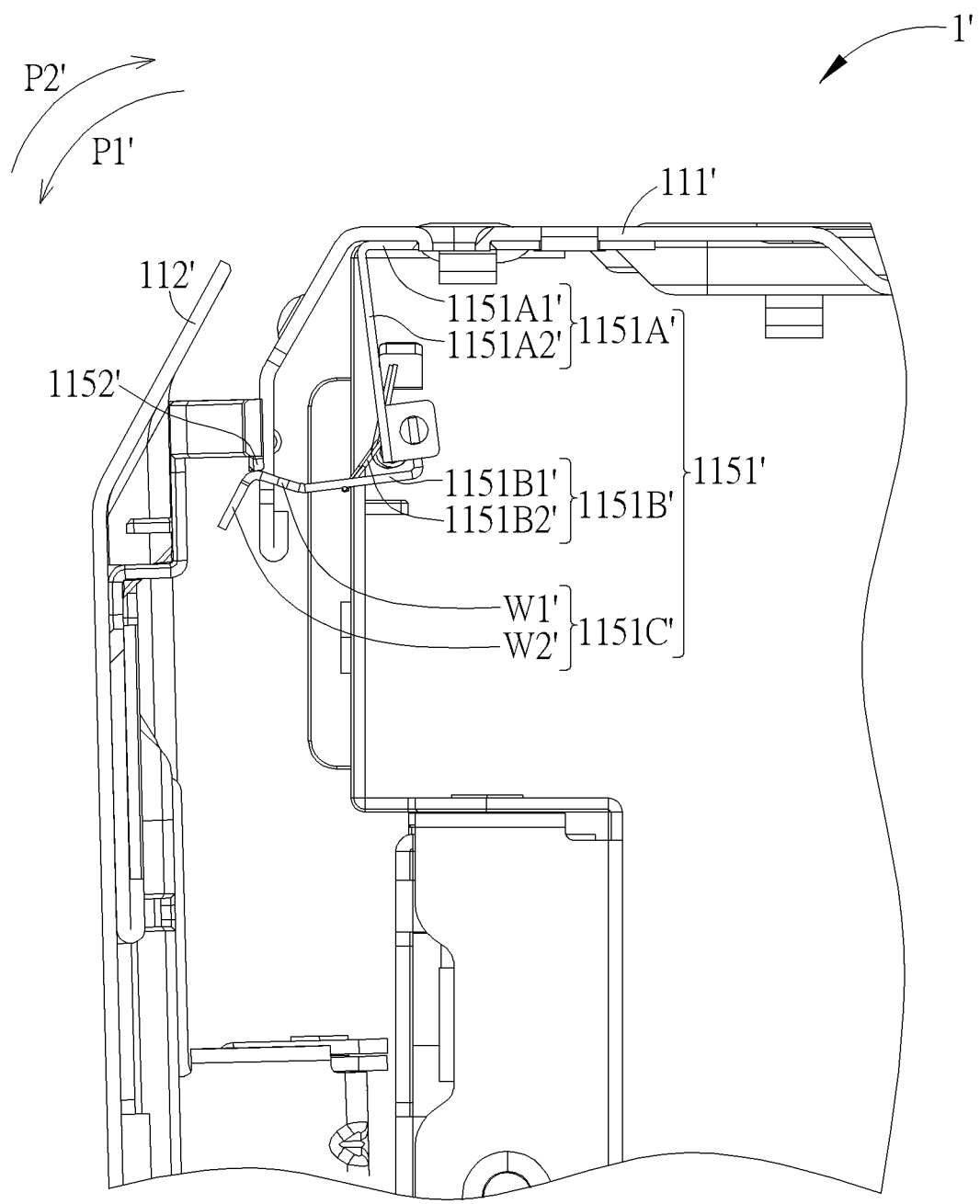

On the other hand, when it is desired to install the lateral plate 112' on the main body 111', the user can apply the second torque along a second pivoting direction P2' opposite to the first pivoting direction P1' on the lateral plate 112'. As shown in FIG. 16, when the lateral plate 112' is forced by the second torque to pivot toward the closed position along the second pivoting direction P2', the restraining protrusion 1152' can push the corresponding second abutting inclined wall W2'. At this moment, since a torque generated by a second acting force acting on the corresponding second abutting inclined wall W2' by each restraining protrusion 1152' relative to the corresponding fulcrum is greater than a torque generated by the second acting force acting on the corresponding second abutting inclined wall W2' by each restraining protrusion 1152' relative to the movable connection of the corresponding movable component 1151B1' and the corresponding first resilient deformation portion 1151A', the second acting force acting on the corresponding second abutting inclined wall W2' by each restraining protrusion 1152' can resiliently deform the corresponding first resilient deformation portion 1151A' along the first pivoting direction P1' for allowing the lateral plate 112' to pivot to the closed position through the supporting position as shown in FIG. 15 along the second pivoting direction P2'. When the lateral plate 112' pivots to the closed position, the user can further operate the lateral plate 112' to slide the lateral plate 112' relative to the main body 111' to the locking position along the sliding direction for driving the locking hook and the locking slot to engage with each other along the sliding direction, so as to accomplish installation of the lateral plate 112'.

During the aforementioned installation process, the lateral plate 112' can be positioned at the supporting position even when an accident occurs, e.g., when the user releases the lateral plate 112' at the closed position. Therefore, the present invention cannot only effectively prevent the lateral plate 112' from falling off and but also prevent damage of devices or injury of personnel caused by the falling lateral plate 112' during the installation process. Furthermore, during a process that the user operates the lateral plate 112' to pivot the lateral plate 112' to the closed position along the second pivoting direction P2', the first resilient deformation portion 1151A' can resiliently recover, i.e., an included angle included between a corresponding first part 1151A1' and a corresponding second part 1151A2' can resiliently recover, once the restraining protrusion 1152' does not push the restraining hook 1151'.

In summary, the restraining mechanism of the present invention can restrain the pivotal angle of the lateral plate relative to the main body along the first pivoting direction to position the lateral plate at the supporting position for preventing the lateral plate from falling off after the lateral plate is located at the unlocking position relative to the main body. Therefore the present invention has better using convenience and safety.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chassis structure comprising:
a main body;
a lateral plate detachably installed on the main body; and
a restraining mechanism disposed between the main body and the lateral plate, the restraining mechanism comprising at least one first restraining component and at least one second restraining component, the at least one first restraining component being configured to abut against the at least one second restraining component to restrain a pivotal angle of the lateral plate relative to the main body along a first pivoting direction for positioning the lateral plate at a supporting position relative to the main body, and a gap being formed between the lateral plate and the main body when the lateral plate is located at the supporting position, the at least one first restraining component being disposed on one of the main body and the lateral plate, the at least one second restraining component being disposed on another one of the main body and the lateral plate, the at least one first restraining component being a restraining hook, the at least one second restraining component being a restraining protrusion, the restraining hook being configured to abut against the restraining protrusion, at least a portion of the restraining hook being made of resilient material, the restraining protrusion pushing the restraining hook to resiliently deform the restraining hook for allowing the lateral plate to pivot to an open position through the supporting position along the first pivoting direction when the lateral plate is pivoted toward the open position along the first pivoting direction, the restraining hook comprising: a first resilient deformation portion disposed on the one of the main body and the lateral plate; and
a second resilient deformation portion extending from the first resilient deformation portion, and the restraining protrusion pushing the restraining hook to resiliently deform the second resilient deformation portion along the first pivoting direction when the lateral plate is pivoted toward the open position along the first pivoting direction.

2. The chassis structure of claim 1, wherein the gap formed between the lateral plate and the main body increases during a process that the lateral plate pivots from the supporting position to the open position along the first pivoting direction.

3. The chassis structure of claim 1, wherein the restraining hook further comprises an abutting protrusion extending from the second resilient deformation portion, the abutting protrusion comprises a first abutting inclined wall, and the restraining protrusion pushes the first abutting inclined wall to resiliently deform the second resilient deformation portion along the first pivoting direction when the lateral plate is pivoted toward the open position along the first pivoting direction.

4. The chassis structure of claim 3, wherein the first resilient deformation portion comprises a first part and a second part, the second resilient deformation portion comprises a third part and a fourth part, the first part is disposed on the one of the main body and the lateral plate, the second part extends from the first part and is connected to the fourth part, the third part extends from the fourth part, and the abutting protrusion extends from the third part.

5. The chassis structure of claim 3, wherein a fulcrum is formed on the first resilient deformation portion, and a first acting force acting on the first abutting inclined wall by the restraining protrusion passes through the fulcrum.

6. The chassis structure of claim 5, wherein the restraining protrusion pushes the restraining hook to resiliently deform the restraining hook for allowing the lateral plate to pivot to a closed position through the supporting position along a second pivoting direction opposite to the first pivoting direction when the lateral plate is pivoted toward the closed position along the second pivoting direction, the gap formed between the lateral plate and the main body decreases during a process that the lateral plate pivots from the supporting position to the closed position along the second pivoting direction, the abutting protrusion further comprises a second abutting inclined wall, an inclined direction of the second abutting inclined wall is opposite to an inclined direction of the first abutting inclined wall, the restraining protrusion pushes the second abutting inclined wall to resiliently deform the first resilient deformation portion along the first pivoting direction when the lateral plate is pivoted toward the closed position along the second pivoting direction, and a second acting force acting on the second abutting inclined wall by the restraining protrusion does not pass through the fulcrum.

7. The chassis structure of claim 3, wherein the second resilient deformation portion comprises a movable component and a resilient component, the movable component is pivotally connected to the first resilient deformation portion, the resilient component is connected between the movable component and the first resilient deformation portion, and the abutting protrusion extends from the movable component.

8. The chassis structure of claim 1, further comprising a pivoting mechanism, the pivoting mechanism having a pivoting axis and being configured to allow the lateral plate to pivot relative to the main body around the pivoting axis, the pivoting mechanism comprising at least one first bending plate and at least one second bending plate, the at least one first bending plate being disposed on the lateral plate, the at least one second bending plate being disposed on the main body, the at least one first bending plate being located above the at least one second bending plate, and an end of the at least one second bending plate being configured to abut against the at least one first bending plate, so as to form the pivoting axis by an abutting cooperation of the at least one first bending plate and the at least one second bending plate.

9. The chassis structure of claim 1, wherein the lateral plate is slidable relative to the main body between a locking position and an unlocking position, the lateral plate is restrained from pivoting relative to the main body when the lateral plate is located at the locking position relative to the main body, the lateral plate is allowed to pivot relative to the main body when the lateral plate is located at the unlocking position relative to the main body, the chassis structure further comprises a locking mechanism disposed between the main body and the lateral plate, the locking mechanism is configured to restrain the lateral plate from pivoting relative to the main body when the lateral plate is located at the locking position relative to the main body, and the locking mechanism is further configured to allow the lateral plate to pivot relative to the main body when the lateral plate is located at the unlocking position relative to the main body.

10. The chassis structure of claim 9, wherein the locking mechanism comprises at least one locking hook and at least one locking slot, the at least one locking hook is disposed on one of the main body and the lateral plate, the at least one locking slot is disposed on another one of the main body and the lateral plate, the at least one locking hook engages with the at least one locking slot to restrain the lateral plate from pivoting relative to the main body when the lateral plate is located at the locking position relative to the main body, the at least one locking hook disengages from the at least one locking slot to allow the lateral plate to pivot relative to the main body when the lateral plate is located at the unlocking position relative to the main body, the lateral plate is slidable relative to the main body along a sliding direction, and the at least one locking hook and the at least one locking slot engage with or disengage from each other along the sliding direction.

11. The chassis structure of claim 10, further comprising a pushing structure, the pushing structure comprising an operating handle and a pushing component, the operating handle being movably linked to the pushing component, the operating handle being pivotally disposed on the lateral plate, and the operating handle driving the pushing component to push the main body to drive the lateral plate to slide relative to the main body from the locking position to the unlocking position when the operating handle pivots relative to the lateral plate.

12. An electronic device comprising:
 a chassis structure comprising:
  a main body;
  a lateral plate detachably installed on the main body; and
  a restraining mechanism disposed between the main body and the lateral plate, the restraining mechanism comprising at least one first restraining component and at least one second restraining component, the at least one first restraining component being configured to abut against the at least one second restraining component to restrain a pivotal angle of the lateral plate relative to the main body along a first pivoting direction for positioning the lateral plate at a supporting position relative to the main body, and a gap being formed between the lateral plate and the main body when the lateral plate is located at the supporting position, the at least one first restraining component being disposed on one of the main body and the lateral plate, the at least one second restraining component being disposed on another one of the main body and the lateral plate, the at least one first restraining component being a restraining hook, the at least one second restraining component being a restraining protrusion, the restraining hook being configured to abut against the restraining protrusion, at least a portion of the restraining hook being made of resilient material, the restraining protrusion pushing the restraining hook to resiliently deform the restraining hook for allowing the lateral plate to pivotally pass through the supporting position when the lateral plate is pivoted toward an open position or a closed position, the restraining hook comprising:
  a first resilient deformation portion disposed on the one of the main body and the lateral plate; and
  a second resilient deformation portion extending from the first resilient deformation portion, the restraining protrusion pushing the restraining hook to resiliently deform the second resilient deformation portion along the first pivoting direction when the lateral plate is pivoted toward the open position along the first pivoting direction, and the restraining protrusion pushing the restraining hook to resiliently deform the first resilient deformation portion along the first pivoting direction when the lateral plate is pivoted toward the closed position along the second pivoting direction; and
 at least one electronic module installed inside the chassis structure.

13. The electronic device of claim 12, wherein the gap formed between the lateral plate and the main body increases during a process that the lateral plate pivots from the supporting position to the open position along the first pivoting direction, and the gap formed between the lateral plate and the main body decreases during a process that the lateral plate pivots from the supporting position to the closed position along a second pivoting direction opposite to the first pivoting direction.

14. The electronic device of claim 12, wherein the restraining hook further comprises an abutting protrusion extending from the second resilient deformation portion, the abutting protrusion comprises a first abutting inclined wall and a second abutting inclined wall, an inclined direction of the second abutting inclined wall is opposite to an inclined direction of the first abutting inclined wall, the restraining protrusion pushes the first abutting inclined wall to resiliently deform the second resilient deformation portion along the first pivoting direction when the lateral plate is pivoted toward the open position along the first pivoting direction, and the restraining protrusion pushes the second abutting inclined wall to resiliently deform the first resilient deformation portion along the first pivoting direction when the lateral plate is pivoted toward the closed position along the second pivoting direction.

15. The electronic device of claim 14, wherein the first resilient deformation portion comprises a first part and a second part, the second resilient deformation portion comprises a third part and a fourth part, the first part is disposed on the one of the main body and the lateral plate, the second part extends from the first part and is connected to the fourth part, the third part extends from the fourth part, and the abutting protrusion extends from the third part.

16. The electronic device of claim 14, wherein the second resilient deformation portion comprises a movable component and a resilient component, the movable component is pivotally connected to the first resilient deformation portion, the resilient component is connected between the movable component and the first resilient deformation portion, and the abutting protrusion extends from the movable component.

\* \* \* \* \*